United States Patent
Iisaka et al.

(10) Patent No.: US 10,524,401 B2
(45) Date of Patent: *Dec. 31, 2019

(54) COMPONENT MOUNTING DEVICE

(71) Applicant: FUJI CORPORATION, Chiryu (JP)

(72) Inventors: Jun Iisaka, Nisshin (JP); Hidetoshi Ito, Okazaki (JP); Hidetoshi Kawai, Chiryu (JP); Shigeto Oyama, Kariya (JP); Naohiro Kato, Okazaki (JP); Kuniyasu Nakane, Okazaki (JP); Ryo Nagata, Okazaki (JP); Keisuke Nagiri, Nagoya (JP)

(73) Assignee: FUJI CORPORATION, Chiryu (JP)

( * ) Notice: Subject to any disclaimer, the term of this patent is extended or adjusted under 35 U.S.C. 154(b) by 339 days.

This patent is subject to a terminal disclaimer.

(21) Appl. No.: 15/129,187

(22) PCT Filed: Mar. 27, 2014

(86) PCT No.: PCT/JP2014/058869
§ 371 (c)(1),
(2) Date: Sep. 26, 2016

(87) PCT Pub. No.: WO2015/145665
PCT Pub. Date: Oct. 1, 2015

(65) Prior Publication Data
US 2017/0112031 A1 Apr. 20, 2017

(51) Int. Cl.
*H05K 13/08* (2006.01)
(52) U.S. Cl.
CPC .................... *H05K 13/08* (2013.01)
(58) Field of Classification Search
CPC ...... A47L 15/16; A47L 15/4221; A47L 15/46; H05K 13/04; H05K 13/08; H05K 13/0812; H05K 13/0853
See application file for complete search history.

(56) References Cited

U.S. PATENT DOCUMENTS 5,369,493 A * 11/1994 Tomita ............... H05K 13/0812
356/400
6,077,321 A * 6/2000 Adachi ............. H01L 21/67028
204/298.25

(Continued)

FOREIGN PATENT DOCUMENTS

EP 1 542 523 A1 6/2005
JP 8-255996 A 10/1996

(Continued)

OTHER PUBLICATIONS

European Office Action dated Oct. 2, 2018 in Patent Application No. 14 886 847.4, 5 pages.

(Continued)

*Primary Examiner* — Minh N Trinh
(74) *Attorney, Agent, or Firm* — Oblon, McClelland, Maier & Neustadt, L.L.P.

(57) ABSTRACT

A component mounting machine moves a mounting head from a supply position P1 to each of mounting positions P3 and P4 of a circuit board CB via an imaging position P2. Further, the component mounting machine performs control such that the mounting head moves in a direction of movement at the time of imaging that is either of an X-axis direction or a Y-axis direction when passing through the imaging position P2. The component mounting machine determines the direction of movement at the time of imaging, according to a first X-axis distance Lx and a first Y-axis distance Ly from the imaging position P2 to each of the mounting positions P3 and P4.

7 Claims, 11 Drawing Sheets

(56) References Cited

U.S. PATENT DOCUMENTS

| | | | |
|---|---|---|---|
| 6,144,452 A | 11/2000 | Hachiya | |
| 6,178,626 B1* | 1/2001 | Hada | H05K 13/0812 29/833 |
| 9,913,384 B2* | 3/2018 | Kodama | H05K 13/04 |
| 2002/0031279 A1 | 3/2002 | Shimizu | |
| 2005/0259862 A1 | 11/2005 | Kabeshita et al. | |
| 2017/0112031 A1* | 4/2017 | Iisaka | H05K 13/08 |
| 2017/0142875 A1* | 5/2017 | Iisaka | H05K 13/0413 |

FOREIGN PATENT DOCUMENTS

| | | |
|---|---|---|
| JP | 10-41700 A | 2/1998 |
| JP | 2002-94296 A | 3/2002 |
| JP | 2007-13021 A | 1/2007 |
| JP | 2007-201284 A | 8/2007 |

OTHER PUBLICATIONS

International Search Report dated Jun. 10, 2014 in PCT/JP2014/058869, filed Mar. 27, 2014.
Extended European Search Report dated May 19, 2017 in European Patent Application No. 14886847.4.

* cited by examiner

FIG. 4
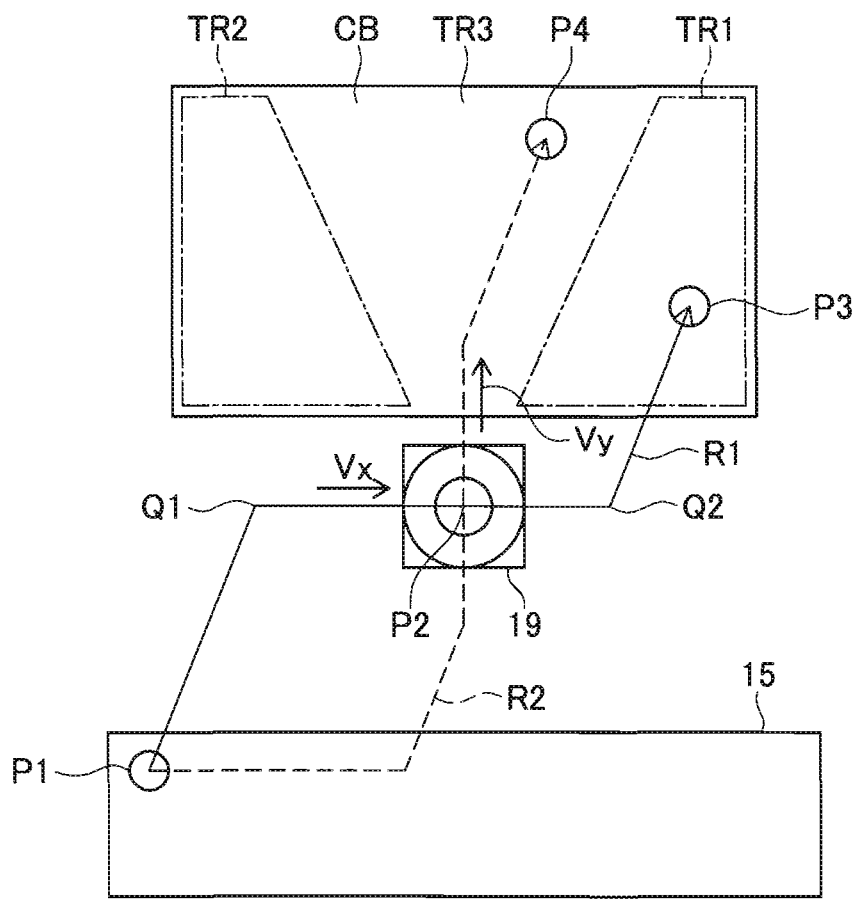
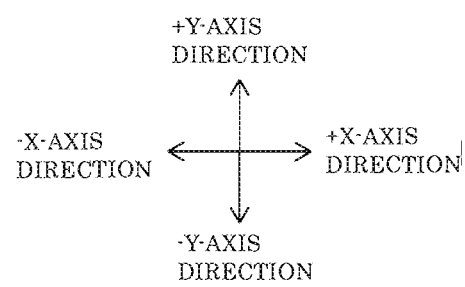

FIG. 7
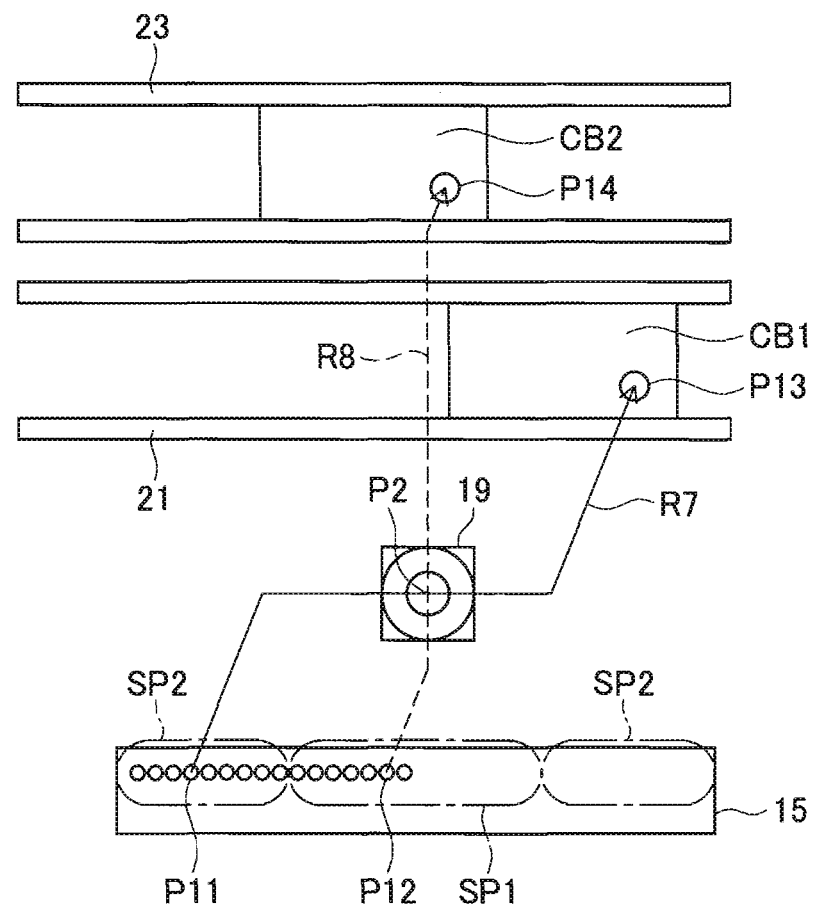
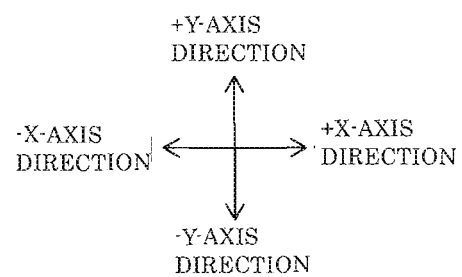

FIG. 8
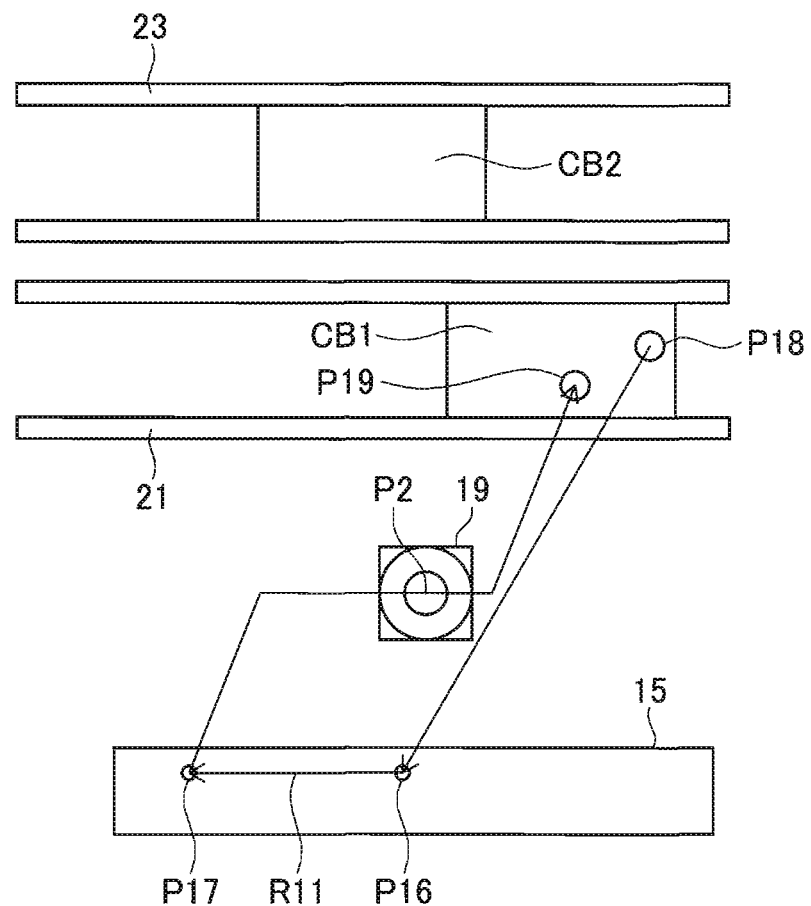
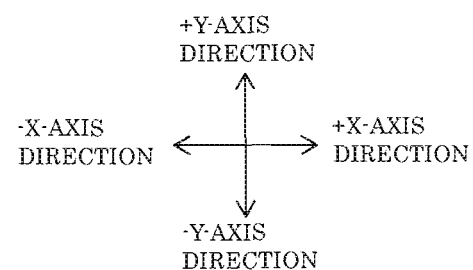

COMPONENT MOUNTING DEVICE

TECHNICAL FIELD

The present application relates to a component mounting device which mounts a component on an object such as a circuit board, and in particular, to control of a movement speed of a movable section when performing a component mounting work.

BACKGROUND ART

In the related art, as one type of a component mounting device which mounts a component on an object, there is a component mounting machine which mounts, for example, an electronic component on a circuit board. As the component mounting machine, there is a component mounting machine which sucks an electronic component by a mounting nozzle of a mounting head, and then, moves the mounting head to above a camera device, captures an image of a suction state, and detects a shift of a suction position from image data captured in an image. The component mounting machine corrects the detected shift of the suction position and mounts the electronic component at a mounting position of the circuit board.

Further, in this type of component mounting machine, there is a component mounting machine which captures an image of a mounting nozzle holding an electronic component, performs imaging while moving the mounting head without stopping (for example, PTL 1 or the like). The imaging that is performed during the movement of the mounting head (hereinafter, there is a case where it is referred to as "imaging during movement") is referred to as On-The-Fly imaging, Fly Vision, or the like. In the component mounting machine disclosed in PTL 1, in a case where a distance from a supply position of an electronic component of a feeder to an imaging position of a camera device (in the literature, a component recognition unit) is longer than a preparation distance required to accelerate a mounting head to a certain speed, imaging is carried out while accelerating the mounting head to above the camera device and then moving the mounting head as it is without temporarily stopping it at an imaging start position.

CITATION LIST

Patent Literature

PTL 1: JP-A-2007-201284

SUMMARY

Incidentally, the component mounting machine described above is generally provided with a driving mechanism which moves the mounting head provided with a mounting nozzle, in an X-axis direction and a Y-axis direction in a horizontal plane. In the component mounting machine of PTL 1, for example, the mounting head which passes above the camera device is controlled so as to move at a constant speed in the X-axis direction in a state where the movement in the Y-axis direction is stopped. That is, in the imaging during movement, imaging is performed in a state where a position in either of the X-axis direction or the Y-axis direction is fixed and the speed is increased in the other direction.

The reason for performing such control is because the mounting head requires time after a command value indicating a movement direction or the movement amount from a control section is input and until a driving mechanism in the X-axis direction or the Y-axis direction performs a stable operation. Specifically, for example, in a driving source (a servomotor or the like) of the driving mechanism, time is required after a change in rotation angle is started to follow the command value and until a rotation angle in a stable state in which overshoot or the like does not occur is obtained. Therefore, a timing when the position or the speed of the mounting head becomes stable is delayed from a timing when the control section sends the command value to the driving mechanism. On the other hand, in order to capture an image of a moving electronic component by the camera device, the mounting head needs to be disposed within a certain area or at a certain position above the camera device. For this reason, in control in the imaging during movement, the position of the mounting head in either of the X-axis direction or the Y-axis direction is fixed, whereby even if shifting of a position occurs due to overshoot or the like, a position is simply shifted back and forth with respect to one direction in which the mounting head moves, and thus it becomes possible to reliably pass the electronic component which is desired to be captured in an image, to a desired imaging position.

Further, the mounting head passes through the imaging position of the camera device and thereafter, moves to the mounting position at which the mounting head mounts the electronic component on the circuit board. Regarding this, in the component mounting machine of the PTL 1 described above, an operation of the mounting head after it passes through the imaging position is not taken into account, and the shortening effect of a mounting time due to the imaging during movement is restrictive. That is, in the imaging during movement, taking into account a moving route of the mounting head from the imaging position to the mounting position, a direction of movement at the imaging position or a direction in which movement is stopped is not necessarily limited to one direction and is optimized in accordance with the moving route of the mounting head, whereby shortening of a mounting time can be expected, and thus there is room for improvement.

The present disclosure has been made in view of the above problem and has an object to provide a component mounting device in which shortening of a mounting time from the supply of a component to the mounting of the component on an object via imaging by an imaging device is possible.

In order to solve the above problem, a component mounting device according to an aspect of this application includes: component supply devices which are placed side by side in a first axis direction and which each supply a component to be mounted on an object to a supply position; a movable section which obtains the component from the supply position and mounts the component at a mounting position of the object; a driving mechanism which moves the movable section in the first axis direction and a second axis direction orthogonal to the first axis direction; an imaging device which captures an image of the component held by the movable section, at an imaging position; and a control section which controls the driving mechanism such that the driving mechanism moves the movable section from the supply position to the mounting position via the imaging position and moves in a direction of movement at the time of imaging with either of the first axis direction or the second axis direction set to be the direction of movement at the time of imaging, when the movable section passes through the imaging position, wherein the control section determines the direction of movement at the time of imaging, according to a first distance along the first axis direction and a second distance along the second axis direction from the imaging position to the mounting position.

Further, according to the component mounting device according to an aspect, the driving mechanism is a driving mechanism in which acceleration or a maximum speed by which the movable section is moved in the first axis direction and acceleration or a maximum speed by which the movable section is moved in the second axis direction are different from each other, and the control section determines the direction of movement at the time of imaging, based on a relationship between an area set in the object according to the first distance and the second distance and the mounting position, and the area is changed based on a difference between the maximum speed with respect to the first axis direction of the movable section and the maximum speed with respect to the second axis direction, and a difference between the acceleration with respect to the first axis direction of the movable section and the acceleration with respect to the second axis direction.

Further, according to the component mounting device according to an aspect, the control section determines the direction of movement at the time of imaging, according to a third distance along the first axis direction from the supply position to the imaging position.

Further, according to the component mounting device according to an aspect, the component mounting device further includes a conveyance lane which conveys the object in the first axis direction, wherein the control section determines the supply position and a stop position on the conveyance lane such that the imaging position is disposed between the supply position and the mounting position of the object which is stopped at the stop position, in the first axis direction, and such that a direction toward the mounting position from the supply position becomes the direction of movement at the time of imaging.

Further, according to the component mounting device according to an aspect, a plurality of the conveyance lanes are provided, and the control section determines a supply position of a component to be mounted on the object which is conveyed by the conveyance lane in which a distance along the second axis direction from the supply device is longer, among the plurality of conveyance lanes, to be a position at which a third distance along the first axis direction from the supply position to the imaging position is shorter.

Further, according to the component mounting device according to an aspect, the movable section is configured such that a plurality of components can be held, and the control section controls the movable section such that in a case where the direction of movement at the time of imaging is determined to be the first axis direction, the movable section obtains the component at the supply position which becomes a position at which a third distance along the first axis direction from the supply position to the imaging position is longer, later, and such that in a case where the direction of movement at the time of imaging is determined to be the second axis direction, the movable section obtains the component at the supply position which becomes a position at which the third distance is shorter, later.

Further, according to the component mounting device according to an aspect, a plurality of the movable sections are provided, and the control section makes the plurality of movable sections in which the orders of sequences of moving the movable section from the supply position to the mounting position via the imaging position are the same and which pass through an imaging position of the same imaging device in the same direction of movement at the time of imaging, pass through the imaging position with the movable sections interlocked with one another.

Further, according to an aspect of this application, there is provided a component mounting device including: component supply devices which are placed side by side in a first axis direction and which each supply a component to be mounted on an object to a supply position; a movable section which has a plurality of mounting nozzles that obtain the component from the supply position, and mounts the component obtained by each of the plurality of mounting nozzles, at a mounting position of the object; a driving mechanism which moves the movable section in the first axis direction and a second axis direction orthogonal to the first axis direction; an imaging device which captures an image of the component held by each of the plurality of mounting nozzles, at an imaging position; and a control section which temporarily stops the movable section after the movable section moves from the supply position to the imaging position, carries out imaging by the imaging device each time each of the components held by the plurality of mounting nozzles is alternately moved to the imaging position, and determines a direction of moving the movable section for the following final imaging after the ending of last imaging before final imaging among a plurality of times of imaging of capturing images of the respective components held by the plurality of mounting nozzles, to be a direction toward the first mounting position from the imaging position after imaging.

Further, according to the component mounting device according to an aspect, the control section determines the component which is first captured in an image, according to a direction toward the imaging position from the supply position of a component which is finally obtained, among the components which are obtained by each of the plurality of mounting nozzles from a plurality of supply positions of the component supply device.

In the component mounting device of an aspect, the control section controls the driving mechanism, thereby moving the movable section from the supply position of the component supply device to the mounting position of the object via the imaging position of the imaging device. Further, the control section controls the driving mechanism such that the driving mechanism moves in the direction of movement at the time of imaging that is either of the first axis direction or the second axis direction, when the movable section passes through the imaging position. Then, the control section determines the direction of movement at the time of imaging, according to the first distance along the first axis direction from the imaging position to the mounting position and the second distance along the second axis direction from the imaging position to the mounting position. In this way, with respect to the direction of movement at the time of imaging, a more appropriate direction according to the first distance and the second distance in a moving route of the movable section from the imaging position to the mounting position is set. For this reason, according to the component mounting device, by optimizing the direction of movement at the time of imaging in accordance with the moving route of the movable section (the mounting position or the like) for each sequence of a component mounting work without limiting the direction of movement at the time of imaging to one direction, it becomes possible to attain shortening of a mounting time.

In the component mounting device of an aspect, with respect to a movement speed of the movable section, speeds on at least one side of the acceleration and the maximum speed in the first axis direction and the acceleration and the maximum speed in the second axis direction are different from each other. Regarding this, the control section determines the direction of movement at the time of imaging, based on the relationship between the area set in the object according to the first distance and the second distance and the mounting position. However, the area is changed based on a difference in either the acceleration or the maximum speed. A change of the area may be carried out by the control section. Further, the control section may carry out processing by using an area changed in advance. Here, in the movable section, in a case where the accelerations or the maximum speeds in the first and second axis directions are different, even if the first and second distances are the same, the times required for movement in the respective directions become different. Regarding this, the control section determines the first and second distances by using the area in which a difference in acceleration or the like is taken into account, whereby it becomes possible to determine the more optimized direction of movement at the time of imaging. Therefore, according to the component mounting device, it becomes possible to more reliably attain shortening of a mounting time.

In the component mounting device of an aspect, the control section determines the direction of movement at the time of imaging, according to the third distance along the first axis direction from the supply position to the imaging position. Here, in the direction of movement at the time of imaging, an optimal direction is different according to the positional relationship between the supply position and the imaging position. For example, in a case where the third distance is short, that is, the supply position and the imaging position are at positions close to each other, if the movable section starts to move toward the imaging position from the supply position, before the position in the second axis direction becomes the same position as the imaging position, the position in the first axis direction becomes the same position, and thus it becomes necessary to stop the movement in the first axis direction. In this case, it becomes effective to make the direction of movement at the time of imaging the second axis direction. For this reason, the control section optimizes the direction of movement at the time of imaging, according to the third distance, whereby shortening of a mounting time can be appropriately carried out.

In the component mounting device of an aspect, the control section determines the supply position and the stop position such that the imaging position is disposed between the mounting position of the object which is stopped at a stop position of the conveyance lane and the supply position in the first axis direction. Further, the control section determines the supply position and the stop position such that a direction toward the mounting position from the supply position becomes the direction of movement at the time of imaging. In this way, the control section changes the supply position and the stop position, whereby the optimization of the direction of movement at the time of imaging becomes possible, and thus it becomes possible to attain shortening of a mounting time.

In the component mounting device of an aspect, the control section determines the supply position of the component to be mounted on the object which is conveyed by the conveyance lane in which a distance along the second axis direction from the supply device is longer, among the plurality of conveyance lanes, to be the position at which the third distance along the first axis direction from the supply position to the imaging position is shorter. In this way, the control section correlates the position at which the third distance is shorter, that is, the supply position at which it is difficult to make the direction of movement at the time of imaging the first axis direction, with the mounting position of the object at which the distance in the second axis direction is longer, that is, the mounting position at which a possibility that it may become effective to make the direction of movement at the time of imaging the second axis direction is high, whereby it becomes possible to attain the optimization of the direction of movement at the time of imaging.

In the component mounting device of an aspect, the movable section is configured such that a plurality of components can be held. The control section controls the movable section such that in a case where the direction of movement at the time of imaging is determined to be the first axis direction, the movable section obtains the component at the supply position which becomes the position at which the third distance along the first axis direction from the supply position to the imaging position is longer, later. Further, the control section controls the movable section such that in a case where the direction of movement at the time of imaging is determined to be the second axis direction, the movable section obtains the component at the supply position which becomes the position at which the third distance is shorter, later. In this way, the control section optimizes the order of obtaining a plurality of components in accordance with the direction of movement at the time of imaging, whereby it becomes possible to attain shortening of a mounting time.

In the component mounting device of an aspect, the control section makes the plurality of movable sections in which the orders of sequences of moving the movable section from the supply position to the mounting position via the imaging position are the same and which pass through the imaging position of the same imaging device in the same direction of movement at the time of imaging, pass through the imaging position with the movable section interlocked with one another. In this way, in a case where a single imaging device is shared and used by the plurality of movable sections, an imaging wait time of each movable section is shortened.

In the component mounting device of an aspect, the control section temporarily stops the movable section having the plurality of mounting nozzles after the movable section moves from the supply position to the imaging position. Next, the control section carries out imaging by the imaging device each time each of the components held by the plurality of mounting nozzles is alternately moved to the imaging position. Then, the control section determines the direction of moving the movable section for the following final imaging after the last imaging before final imaging is ended, to be the direction toward the first mounting position from the imaging position after imaging. In this way, in the movable section, the imaging during movement becomes possible in the imaging of the final component, and the movable section can accelerate and move toward the first mounting position of the object from the imaging position while performing imaging. Therefore, according to the component mounting device, it becomes possible to attain shortening of the movement time of the movable section.

In the component mounting device of an aspect, the control section determines the component which is first captured in an image, according to the direction toward the imaging position from the supply position of the component which is finally obtained, among the components which are obtained by each of the plurality of mounting nozzles from the plurality of supply positions of the component supply device. Preferably, the control section makes the component which becomes the lead in the direction toward the imaging position from the supply position of the component which is finally obtained, among the components held by each of the plurality of mounting nozzles, the component which is first captured in an image. In this way, the control section can advance a start timing of imaging after the movable section is moved to the imaging position.

BRIEF DESCRIPTION OF DRAWINGS

FIG. 4 is a plan view schematically showing a moving route in which a mounting nozzle of a mounting head moves.

FIG. 7 is a schematic diagram for describing the positional relationship between a stop position of a circuit board and a supply position.

FIG. 8 is a plan view schematically showing a moving route in which a mounting nozzle of a mounting head of a third example moves.

DESCRIPTION OF EMBODIMENTS

First Example

Figure 1:
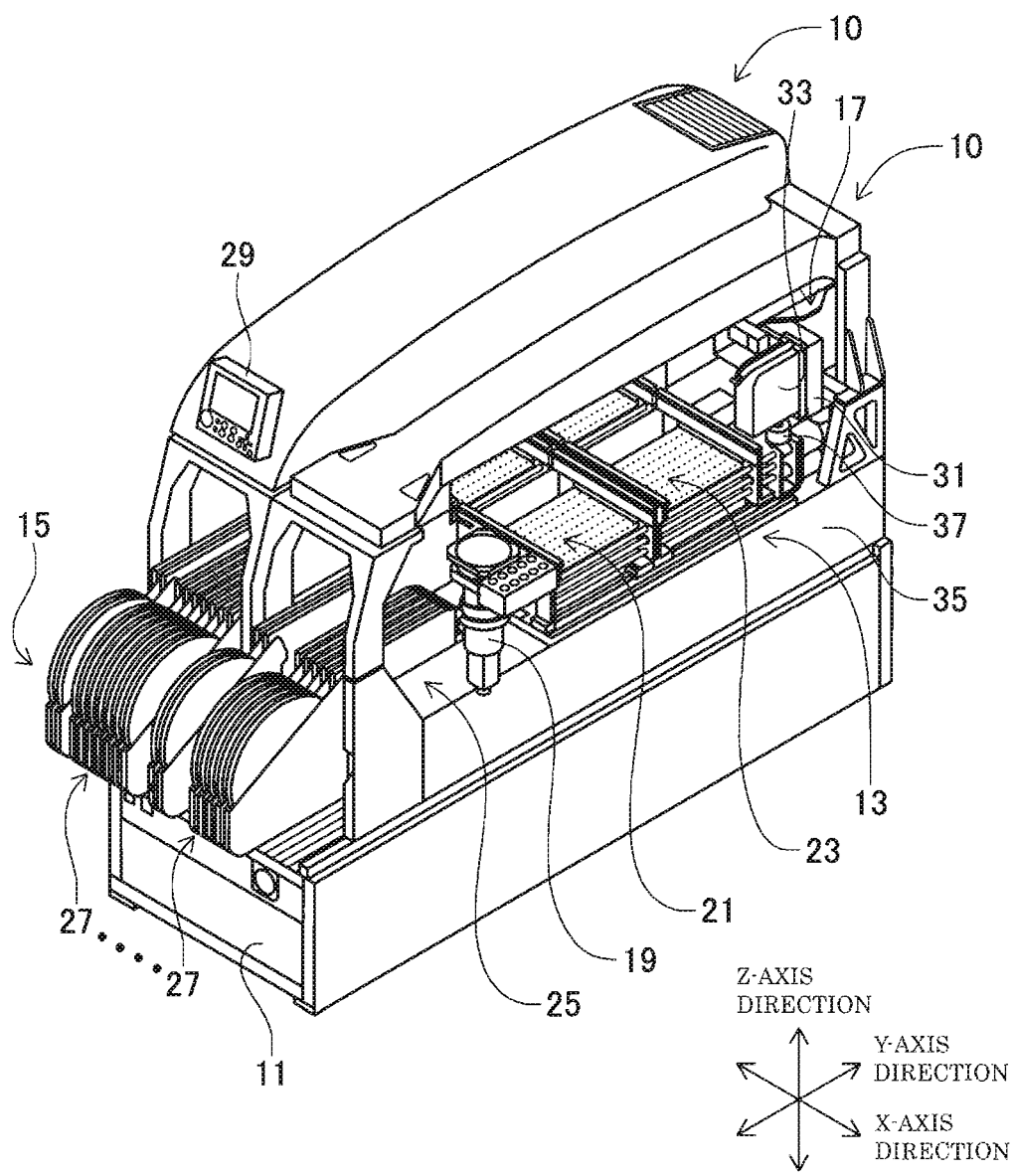
FIG. 1 is a perspective view showing a device configuration of a component mounting machine of a first example.

Hereinafter, an example embodying the present disclosure will be described with reference to the drawings. FIG. 1 is a perspective view showing a component mounting machine 10 of a first example. In FIG. 1, two component mounting machines 10 provided side by side on a common base 11 are shown. The component mounting machine 10 is a device which is connected with another device such as a solder printing machine, a board inspection machine, or a reflow machine, for example, thereby configuring a production line, and produces a circuit board on which a large number of electronic components are mounted. The two component mounting machines 10 have the same configuration, and therefore, description will be made with a focus on one of them. In the component mounting machine 10, various devices such as a board conveyance device 13, a component supply device 15, a head driving mechanism 17, and a camera device 19 are mounted on the common base 11. In the following description, as shown in FIG. 1, a direction in which the component mounting machines 10 are provided side by side is described to be referred to as an X-axis direction, a direction that is parallel to a board plane of a circuit board which is conveyed, and is perpendicular to the X-axis direction is described to be referred to as a Y-axis direction, and a direction perpendicular to both the X-axis direction and the Y-axis direction is described to be referred to as a Z-axis direction.

The board conveyance device 13 is a so-called double conveyor type device in which a first conveyance device 21 and a second conveyance device 23 are provided side by side in the Y-axis direction. Each of the first and second conveyance devices 21 and 23 has a pair of conveyor belts (not shown) disposed along the X-axis direction. Each of the first and second conveyance devices 21 and 23 makes the pair of conveyor belts orbit, thereby conveying a circuit board supported on the conveyor belts in the X-axis direction. Further, each of the first and second conveyance devices 21 and 23 clamps and fixes the circuit board which has been conveyed to a stop position at which a component mounting work is performed, in the Z-axis direction by a stopper (not shown) provided above the circuit board and a clamper (not shown) provided below the circuit board. For example, each of the first and second conveyance devices 21 and 23 conveys the circuit board which has been carried in from an upstream device such as a solder printing machine, in the X-axis direction and clamps the circuit board at the stop position. If the mounting work is ended, the first and second conveyance devices 21 and 23 convey the circuit board in the X-axis direction and carry the circuit board out to a device of the subsequent stage.

The component supply device 15 is a feeder type device and is provided at a front end portion (the lower left side of FIG. 1) in the Y-axis direction of the component mounting machine 10. The component supply device 15 is provided side by side in the X-axis direction and has a plurality of feeders 25 provided on the common base 11. Each of the feeders 25 is configured so as to be detachable with respect to the common base 11 and supplies an electronic component from a tape feeder 27 to a supply position. The tape feeder 27 is a medium for supplying the electronic component, and a carrier tape which holds a large number of electronic components at a regular interval is wound around the tape feeder 27. In the feeder 25, the tip of the carrier tape is drawn to the supply position, and the feeder 25 supplies a different type of electronic component for each carrier tape. The supply positions of the respective feeders 25 are provided side by side along the X-axis direction. Therefore, if the type of the electronic component is different, the supply position becomes a different position in the X-axis direction.

Further, the head driving mechanism 17 is an XY robot type moving device. The head driving mechanism 17 is provided with an X-axis driving mechanism 41 (refer to FIG. 2) which slides a slider 31 in the X-axis direction by the drive of an electromagnetic motor, and a Y-axis driving mechanism 43 (refer to FIG. 2) which slides the slider 31 in the Y-axis direction. A mounting head 33 is mounted on the slider 31. The two driving mechanisms 41 and 43 are driven, whereby the mounting head 33 moves to an arbitrary position on a frame section 35 of each of the component mounting machines 10 placed on the common base 11. Each of the X-axis driving mechanism 41 and the Y-axis driving mechanism 43 can use, for example, a linear motor mechanism, a ball screw feed mechanism, or the like as a driving source.

A nozzle holder 37 is provided below the mounting head 33. The nozzle holder 37 holds downward a plurality of mounting nozzles. Each of the mounting nozzles leads to negative pressure air and positive pressure air passages through a positive and negative pressure supply device (not shown), and sucks and holds the electronic component with negative pressure, and separates the held electronic component due to slight positive pressure being supplied thereto. The mounting head 33 has an R-axis rotational driving mechanism 45 (refer to FIG. 2) which rotationally drives the nozzle holder 37 around a Z-axis. Further, the mounting head 33 has a Z-axis driving mechanism 47 (refer to FIG. 2) which individually extends the selected mounting nozzle downward in the Z-axis direction and retreats the selected mounting nozzle upward in the Z-axis direction. Further, the mounting head 33 has a Q-axis rotational driving mechanism 49 (refer to FIG. 2) which individually rotationally drives the selected mounting nozzle around the Z-axis. Each of these driving mechanisms 45 to 49 can use, for example, a servomotor as a driving source.

The camera device 19 is provided between the board conveyance device 13 and the component supply device 15 in the Y-axis direction. The camera device 19 is installed on the frame section 35 so as to be able to capture an image on the upper side. An imaging position in this example is set to an upper space of the camera device 19. The camera device 19 captures an image of the electronic component suctioned to the mounting nozzle, which passes through the imaging position, from the lower side.

Figure 2:
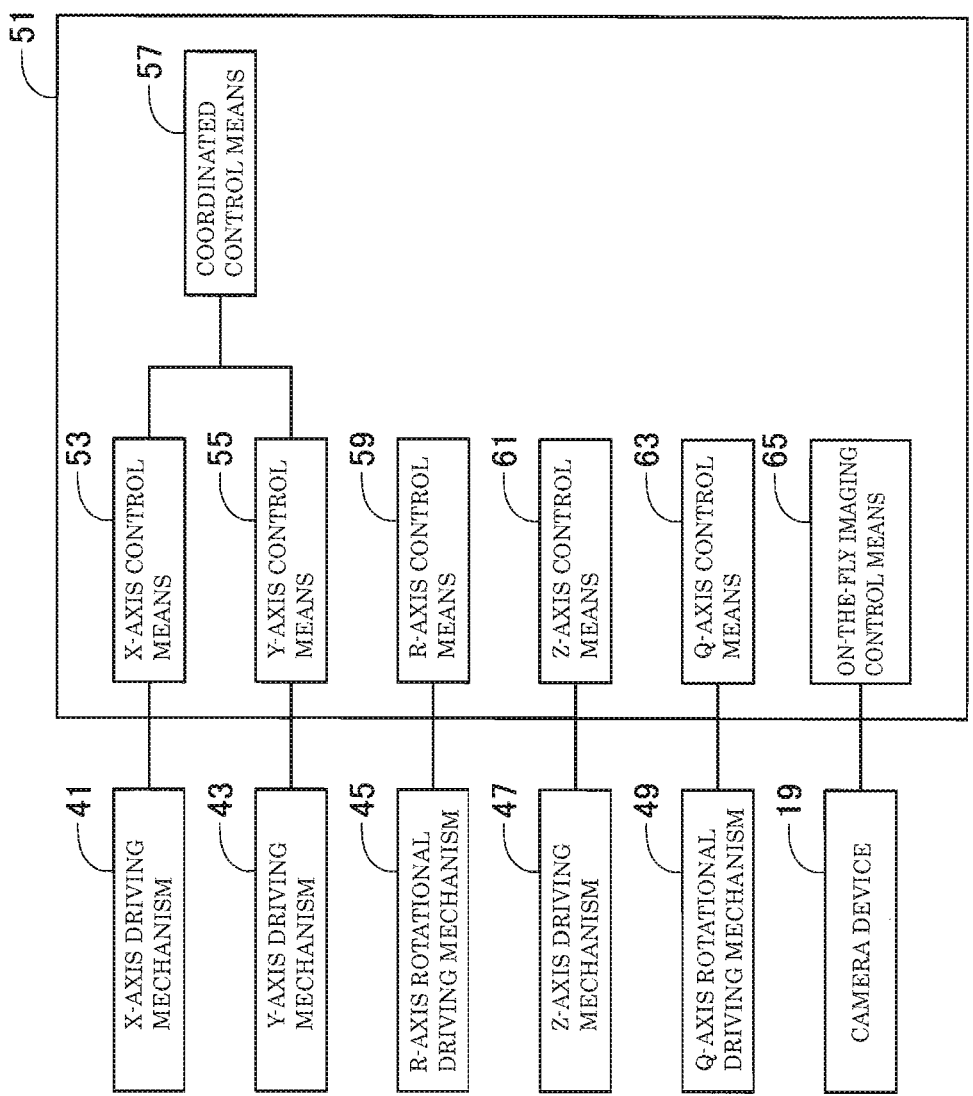
FIG. 2 is a functional block diagram for describing a control function related to a component mounting work of a control computer.

A control section 51 shown in FIG. 2 is connected to the board conveyance device 13, the component supply device 15, the head driving mechanism 17, and the camera device 19 by communication cables. The control section 51 obtains various information from the respective devices 13 to 19 and executes a calculation, a determination, or the like, based on the obtained information. Further, the control section 51 appropriately controls the operations of the devices 13 to 19, based on the calculation result or the determination result.

In the component mounting machine 10 of this example, the component mounting work is controlled by the control section 51. Further, in the component mounting machine 10, an operation device 29 (refer to FIG. 1) is provided at a front end portion of an upper cover. An operator can confirm information output from the control section 51 to the operation device 29 and perform a necessary operation or setting on the operation device 29.

In the component mounting machine 10 having the configuration described above, a mounting work of mounting the electronic component at the supply position at a mounting position of the circuit board by driving the mounting head 33 is repeatedly carried out based on the control of the control section 51. Specifically, first, the head driving mechanism 17 moves the mounting head 33 to above the supply position of the feeder 25 to which the electronic component to be mounted is supplied. The mounting head 33 sucks the electronic component at the supply position by the mounting nozzle. Next, the head driving mechanism 17 moves the mounting head 33 to the imaging position above the camera device 19. The camera device 19 captures an image of a state where the mounting nozzle is suctioning the electronic component, from the lower side. Next, the head driving mechanism 17 moves the mounting head 33 to above the circuit board positioned at a stop position by the board conveyance device 13. The control section 51 corrects a shift of a suction position of the electronic component held by the mounting nozzle, based on the imaging data of the camera device 19, before the electronic component is mounted at the mounting position of the circuit board. Then, the mounting head 33 drives the Z-axis driving mechanism 47, thereby extending the mounting nozzle downward in the Z-axis direction. If the electronic component comes into contact with the mounting position of the circuit board, the mounting head 33 eliminates the negative pressure of the mounting nozzle, thereby separating the electronic component, and mounts the electronic component on the circuit board.

FIG. 2 is a functional block diagram for describing a control function related to the component mounting work of the control section 51 with which the component mounting machine 10 is provided. The control section 51 is configured mainly of a computer and is provided with an arithmetic circuit such as a CPU, and storage devices such as a RAM and a ROM. The control section 51 has X-axis control means 53, Y-axis control means 55, and coordinated control means 57. The X-axis control means 53 controls the X-axis driving mechanism 41, thereby changing a movement speed Vx in the X-axis direction of the mounting head 33. The Y-axis control means 55 controls the Y-axis driving mechanism 43, thereby changing a movement speed Vy in the Y-axis direction of the mounting head 33. The coordinated control means 57 operates the X-axis control means 53 and the Y-axis control means 55 in conjunction with each other, thereby moving the mounting head 33 to an arbitrary position on the frame section 35. Further, the control section 51 has R-axis control means 59 for controlling the R-axis rotational driving mechanism 45, Z-axis control means 61 for controlling the Z-axis driving mechanism 47, and Q-axis control means 63 for controlling the Q-axis rotational driving mechanism 49. Further, the control section 51 has On-The-Fly imaging control means 65 for making the camera device 19 perform imaging with precise timing when the mounting nozzle of the mounting head 33 passes through the imaging position.

Figure 3:
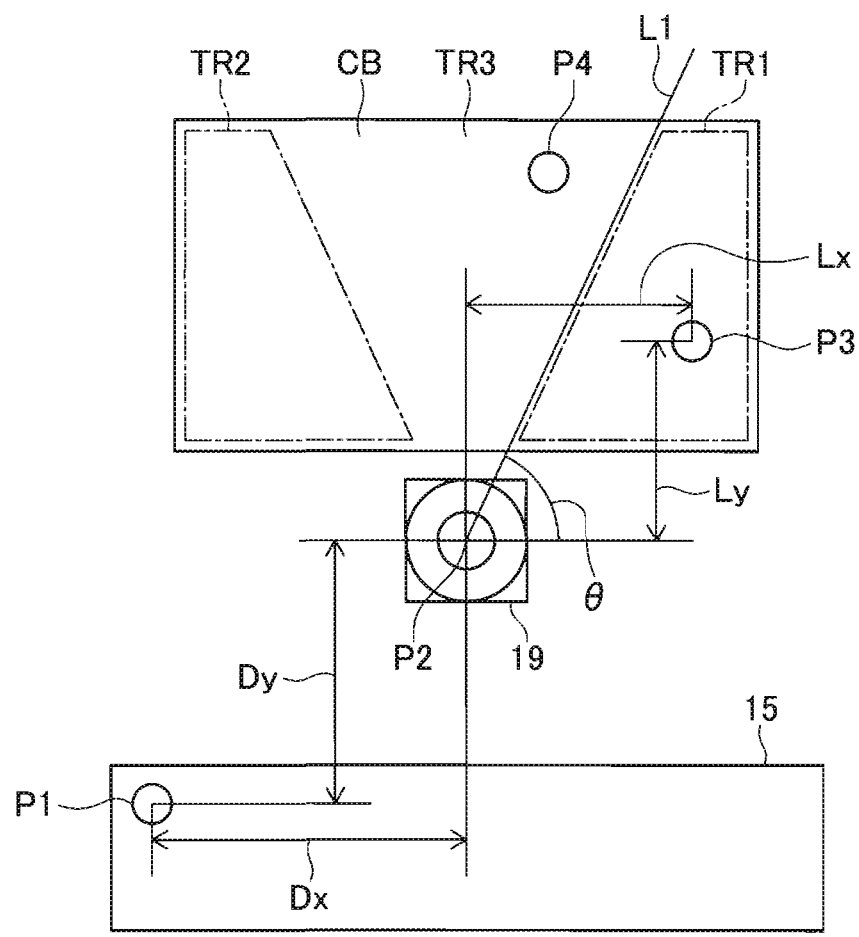
FIG. 3 is a plan view schematically showing a portion related to the component mounting work in the component mounting machine.

Next, a method of controlling the mounting head 33 at the time of the component mounting work by the control section 51 will be described. In the following description, in order to make it easier to understand the contents of the description, the mounting head 33 is assumed to have a configuration in which the mounting nozzle held by the nozzle holder 37 is 1 piece, and only the component mounting work on the circuit board which is conveyed by the first conveyance device 21 is taken into account. FIG. 3 is a plan view schematically showing a portion related to the component mounting work in the component mounting machine 10. In FIG. 3, a supply position P1 of the component supply device 15, an imaging position P2 of the camera device 19, and two mounting positions P3 and P4 on a circuit board CB fixed to the stop position by the first conveyance device 21 (refer to FIG. 1) are shown. The supply position P1 and the mounting positions P3 and P4 are changed according to the type of the electronic component. Further, the imaging position P2 is a fixed position.

Further, in the following description, as shown in FIG. 3, a rightward direction in the drawing is described to be referred to as a +X-axis direction, a leftward direction is described to be referred to as a −X-axis direction, an upward direction is described to be referred to as a +Y-axis direction, and a downward direction is described to be referred to as a −Y-axis direction. Further, a distance along the X-axis direction from the imaging position P2 to each of the mounting positions P3 and P4 is set to be a first X-axis distance Lx (in the drawing, only the first X-axis distance Lx corresponding to the mounting position P3 is shown), and a distance along the Y-axis direction from the imaging position P2 to each of the mounting positions P3 and P4 is set to be a first Y-axis distance Ly. Further, a distance along the X-axis direction from the supply position P1 to the imaging position P2 is set to be a second X-axis distance Dx, and a distance along the Y-axis direction from the supply position P1 to the imaging position P2 is set to be a second Y-axis distance Dy.

In the example shown in FIG. 3, the supply position P1 is located on the −X-axis direction side with respect to the imaging position P2. Further, the mounting positions P3 and P4 are located on the +X-axis direction side with respect to the imaging position P2. In this case, the mounting head 33 moves in the +Y-axis direction while moving in the +X-axis direction, when moving from the supply position P1 to the mounting position P3 or the mounting position P4 through the imaging position P2. Further, after the mounting of the electronic components at the mounting positions P3 and P4 is ended, the mounting head 33 moves in the −Y-axis direction and moves to the supply position of the next electronic component. The control section 51 controls the camera device 19, thereby making the camera device 19 capture an image of the electronic component held by the mounting nozzle of the mounting head 33 which passes through the imaging position P2. In the imaging during movement, the mounting head 33 is fixed in position in either of the X-axis direction or the Y-axis direction and moves in the direction on the other side. The control section 51 determines a direction in which the mounting head 33 moves in the imaging during movement (hereinafter, there is a case where the direction is referred to as a direction of movement at the time of imaging), according to the first X-axis distance Lx and the first Y-axis distance Ly for each mounting position of the component mounting work.

Specifically, areas TR1, TR2, and TR3 are set in the circuit board CB. The area TR1 is an area in which the first X-axis distance Lx becomes longer than the first Y-axis distance Ly on the +X-axis direction side of the circuit board CB. Similarly, the area TR2 is an area in which the first X-axis distance Lx becomes longer than the first Y-axis distance Ly on the −X-axis direction side of the circuit board CB. Further, the area TR3 is an area which includes a central portion of the circuit board CB, and is an area in which the first X-axis distance Lx becomes shorter than the first Y-axis distance Ly. The control section 51 determines the direction of movement at the time of imaging when mounting the electronic component at each of the mounting positions P3 and P4, based on the areas TR1 to TR3.

For example, the control section 51 determines the stop position of the circuit board CB in the first conveyance device 21, and XY-coordinates of the areas TR1 to TR3 according to the stop position. The control section 51 determines the respective mounting positions P3 and P4, based on the determined XY-coordinates of the areas TR1 to TR3. The mounting position P3 is a position which is within the area TR1 and in which the first X-axis distance Lx is longer than the first Y-axis distance Ly. Here, in the imaging during movement, at the imaging position P2, the position of the mounting head 33 in either of the X-axis direction or the Y-axis direction is fixed, whereby the movement of the mounting head 33 is restricted. Then, the mounting head 33 starts to move in a direction in which the movement is restricted, after it has passed through the imaging position P2. On the other hand, in the direction of movement at the time of imaging, the mounting head 33 passes without stopping before and after the imaging position P2. For this reason, taking into account only the movement of the mounting head 33 from the imaging position P2 to the mounting position P3, the +X-axis direction corresponding to the first X-axis distance Lx in which the distance is longer, out of the first X-axis distance Lx and the first Y-axis distance Ly, is set to be the direction of movement at the time of imaging, whereby it becomes possible to shorten the movement time from the imaging position P2 to the mounting position P3. For example, in the case of the mounting position P3, as in a moving route R1 shown in FIG. 4, the mounting nozzle of the mounting head 33 passes through the imaging position P2 with the position in the Y-axis direction fixed and the direction of movement at the time of imaging set to be the +X-axis direction.

Figure 5:
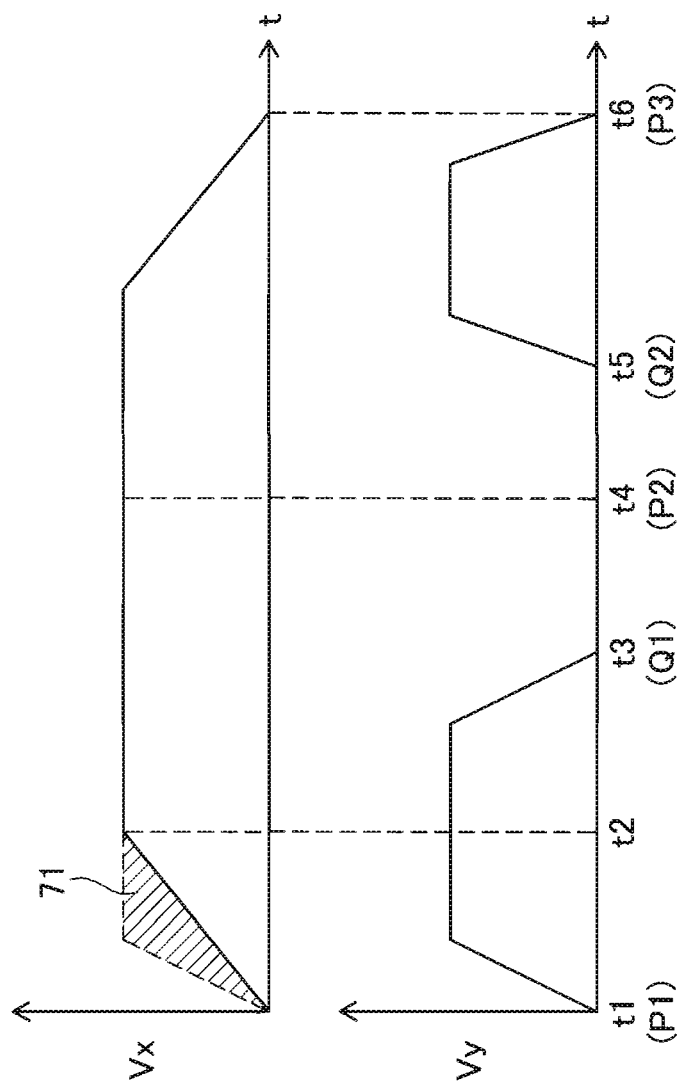
FIG. 5 is a graph showing the relationship between a movement speed in a movement in a moving route R1 to a mounting position P3 and time.

In the case of the moving route R1, the coordinated control means 57 (refer to FIG. 2) drives the X-axis driving mechanism 41 by the X-axis control means 53 and operates the Y-axis driving mechanism 43 by the Y-axis control means 55 in conjunction with the X-axis driving mechanism 41. FIG. 5 shows the relationship between the movement speeds Vx and Vy in the movement in the moving route R1 and time. In FIG. 5, a horizontal axis represents a common time axis t, and the positions (the supply position P1, the imaging position P2, the mounting position P3, positions Q1 and Q2) of the mounting nozzle shown in FIG. 4 are shown together. In the control of the moving route R1, when the mounting nozzle starts from the supply position P1 at time t1, the movement speed Vx and the movement speed Vy are generated. The mounting head 33 moves in the +X-axis direction and the movement speed Vx gradually increases. At time t2, the movement speed Vx of the mounting head 33 is stabilized at a constant speed. Further, the mounting head 33 is accelerated in the +Y-axis direction and the movement speed Vy is stabilized at a constant speed.

Next, the mounting head 33 is decelerated as it approaches the position Q1 (refer to FIG. 4) in which a position in the Y-axis direction becomes the same position as the imaging position P2, and reaches the position Q1 at time t3. The mounting head 33 passes through the imaging position P2 at time t4 in a state where the movement speed Vx is stabilized at a constant speed and the movement speed Vy becomes zero. At this time, the camera device 19 captures an image of the electronic component held by the mounting nozzle of the mounting head 33, based on the control of the On-The-Fly imaging control means 65. The mounting head 33 reaches the position Q2 (refer to FIG. 4) at time t5 after it has passed through the imaging position P2, and starts acceleration in the +Y-axis direction. Then, the mounting head 33 is decelerated as it approaches the mounting position P3, and at time t6, the mounting nozzle reaches the mounting position P3. As described above, in the mounting head 33, the deceleration of the movement speed Vx in the +X-axis direction does not occur before and after the passage of the imaging position P2, and therefore, it becomes possible to attain shortening of the movement time (a time from time t4 to time t6 in FIG. 5) from the imaging position P2 to the mounting position P3, compared to a case of passing through the imaging position P2 in the +Y-axis direction.

On the other hand, as shown in FIG. 4, the mounting position P4 is included in the area TR3, and the first X-axis distance Lx is shorter than the first Y-axis distance Ly. Therefore, in the case of the mounting position P4, as in a moving route R2 shown in FIG. 4, the mounting head 33 is fixed in position in the X-axis direction at the imaging position P2 and moves with the direction of movement at the time of imaging set to be the +Y-axis direction. In this way, in the mounting head 33, the deceleration of the movement speed Vy in the Y-axis direction does not occur before and after the passage of the imaging position P2, and therefore, it becomes possible to attain shortening of the movement time from the imaging position P2 to the mounting position P4.

Here, in the mounting head 33, there is a case where speed performance, for example, acceleration, with respect to each of the X-axis direction and the Y-axis direction is different.

For example, due to a difference of the type or the specification of the driving source (a servomotor or the like) which is mounted on each of the X-axis driving mechanism 41 and the Y-axis driving mechanism 43 of the head driving mechanism 17 (refer to FIG. 1), a difference of the structure of the slider 31 which slides the mounting head 33, or the like, a difference occurs in the speed performance of the mounting head 33. In this case, it is preferable that the control section 51 changes the areas TR1 to TR3 for determining the direction of movement at the time of imaging, based on a difference between acceleration with respect to the X-axis direction of the mounting head 33 and acceleration with respect to the Y-axis direction. As shown in FIG. 5, in the mounting head 33 of this example, the amount of change of the movement speed Vx with respect to the time axis t is smaller than that in the movement speed Vy and the acceleration in the X-axis direction is smaller than the acceleration in the Y-axis direction. On the other hand, the movement speed Vx and the movement speed Vy which become a constant speed become approximately the same speed. Therefore, in the mounting head 33 of this example, in a case of starting the movements in both the X-axis direction and the Y-axis direction from time t1 shown in FIG. 5, at time t2, the movement in the Y-axis direction of the mounting nozzle is ahead compared to the movement in the X-axis direction by a movement distance 71 shown by hatching in the drawing. The control section 51 expands or reduces the ranges of the areas TR1 to TR3 by, for example, an amount corresponding to the movement distance 71.

As shown in FIG. 3, an angle θ between a boundary line L1 between the area TR1 and the area TR3 and the +X-axis direction is set to be greater than or equal to 45 degrees. In a case where the acceleration in the X-axis direction and the acceleration in the Y-axis direction are the same, it is preferable that the boundary line L1 is set to a position at which the angle θ becomes 45 degrees. However, as described above, in a case where there is a difference in acceleration in each direction, the control section 51 changes, for example, the Y-coordinate of the boundary line L1 in which the angle θ becomes 45 degrees, in the +Y-axis direction by an amount corresponding to the movement distance 71. In this way, the control section 51 can set more appropriate areas TR1 to TR3 according to a difference in acceleration with respect to each of the X-axis direction and the Y-axis direction of the mounting head 33. The content of the change described above is an example, and for example, the control section 51 may change the areas TR1 to TR3 according to a difference in maximum speed, as the difference in speed performance between the X-axis driving mechanism 41 and the Y-axis driving mechanism 43. Further, the control section 51 may carry out processing by using the data of the XY-coordinates of the areas TR1 to TR3 changed based on the acceleration or the maximum speed in advance.

As described above, the control section 51 changes the areas TR1 to TR3, based on a difference in acceleration. Then, the control section 51 can determine a more appropriate direction of movement at the time of imaging by determining the first X-axis distances Lx and the first Y-axis distances Ly of the mounting positions P3 and P4, based on the areas TR1 to TR3 after a change. The determination or the change of the direction of movement at the time of imaging can be appropriately executed. For example, the control section 51 may determine and change the direction of movement at the time of imaging, before an operation of each sequence of the component mounting work is started. Alternatively, the control section 51 may determine the direction of movement at the time of imaging of each sequence, based on a production job, before the production of the circuit board CB is started, in a case where the XY-coordinates of the mounting positions P3 and P4 of each sequence are set in control data (a production job) in which, for example, the type or the like of the circuit board CB or the electronic component which is mounted is set. Alternatively, for example, in a case where the setting value of the movement speeds Vx and Vy or the acceleration of the mounting head 33 is changed by an operator, the control section 51 may execute the determination or the change of the direction of movement at the time of imaging, each time it happens.

In the description described above, a case has been described where the supply position P1 is located on the −X-axis direction side with respect to the imaging position P2 and the mounting positions P3 and P4 are located on the +X-axis direction side with respect to the imaging position P2.

However, with respect to the disposition opposite thereto (the supply position P1 is located on the +X-axis direction side and the mounting positions P3 and P4 are located on the −X-axis direction side), the same processing is performed only by reversing the X-axis direction, and therefore, description thereof is omitted here.

According to this example described above in detail, the following effects are exhibited.

Effect 1

The control section 51 of the component mounting machine 10 of this example controls the driving mechanisms 41 and 43 through the control means 53 and 55 and moves the mounting nozzle of the mounting head 33 from the supply position P1 to the mounting positions P3 and P4 of the circuit board CB which is an object, via the imaging position P2. Further, the control section 51 controls the driving mechanisms 41 and 43 such that the mounting head 33 moves in the direction of movement at the time of imaging that is either of the X-axis direction or the Y-axis direction when passing through the imaging position P2. Then, the control section 51 determines the direction of movement at the time of imaging, according to the first X-axis distance Lx and the first Y-axis distance Ly from the imaging position P2 to each of the mounting positions P3 and P4. In this way, with respect to the direction of movement at the time of imaging, a more appropriate direction is set according to the first X-axis distance Lx and the first Y-axis distance Ly from the imaging position P2 to each of the mounting positions P3 and P4. For this reason, according to the component mounting machine 10 of this example, by optimizing the direction of movement at the time of imaging in accordance with the mounting positions P3 and P4 for each sequence without limiting the direction of movement at the time of imaging to one direction, it becomes possible to attain shortening of a mounting time.

Effect 2

In the mounting head 33, the acceleration in the Y-axis direction is larger than the acceleration in the X-axis direction. Regarding this, the control section 51 changes the Y-coordinate of the boundary line L/l between the areas TR1 to TR3 set in the circuit board CB in order to determine the direction of movement at the time of imaging, based on a difference in acceleration. In this way, the control section 51 can determine the more optimized direction of movement at the time of imaging, by determining the mounting positions P3 and P4 by using the areas TR1 to TR3 in which the difference in acceleration is taken into account. Therefore, according to the component mounting machine 10 of this example, it becomes possible to more reliably attain shortening of a mounting time.

Incidentally, the mounting head 33 is an example of a movable section. Each of the X-axis driving mechanism 41 and the Y-axis driving mechanism 43 is an example of a driving mechanism. The camera device 19 is an example of an imaging device. The circuit board CB is an example of an object. The X-axis direction is an example of a first axis direction. The Y-axis direction is an example of a second axis direction. The first X-axis distance Lx is an example of a first distance along the first axis direction from the imaging position to the mounting position. The first Y-axis distance Ly is an example of a second distance along the second axis direction from the imaging position to the mounting position. The electronic component is an example of a component which is mounted on the object.

Second Example (Determination of Direction of Movement at the time of Imaging in Consideration of Supply Position)

Figure 6:
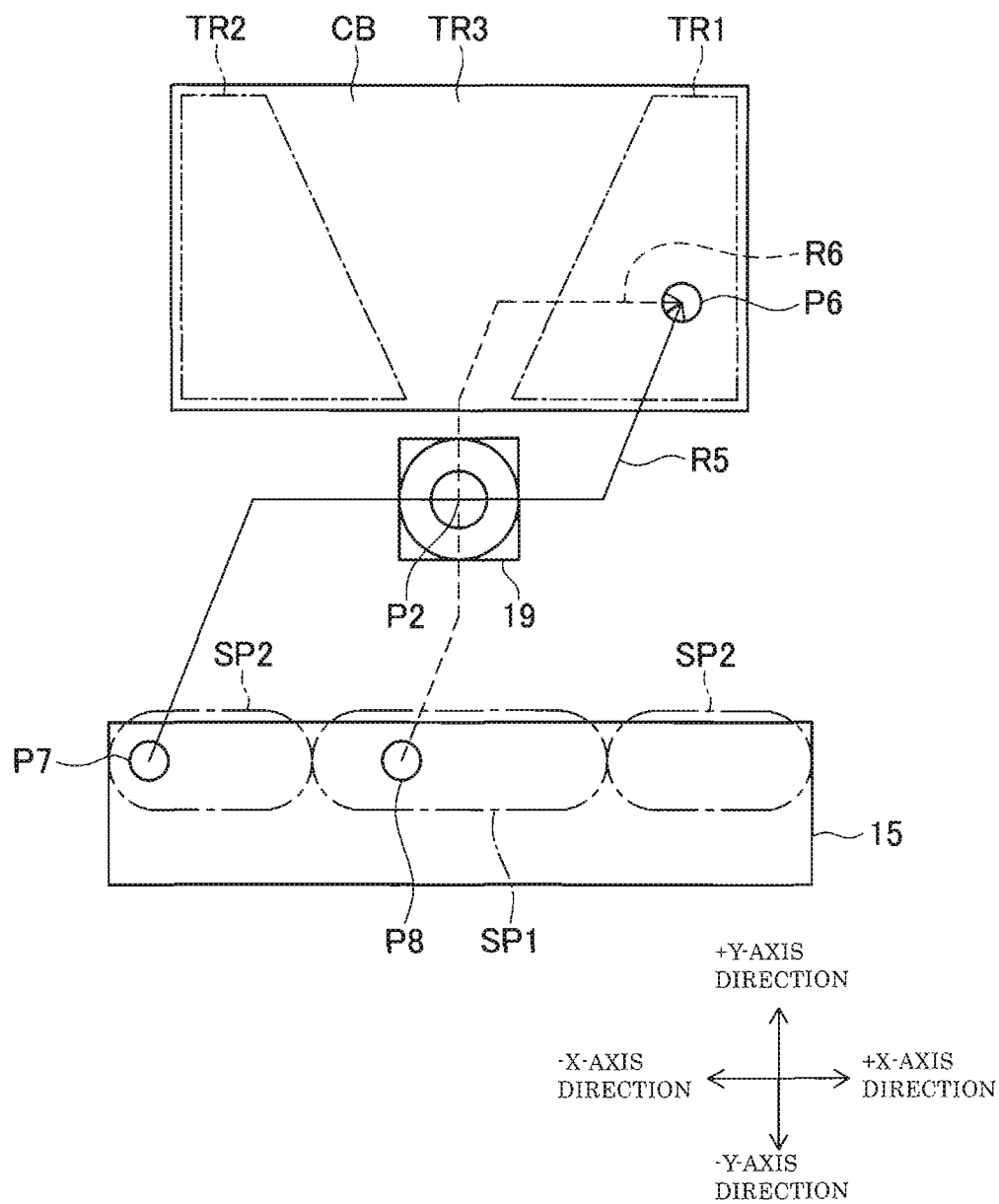
FIG. 6 is a plan view schematically showing a moving route in which a mounting nozzle of a mounting head of a second example moves.

Next, a second example embodying the present disclosure will be described with reference to FIG. 6. In the first example, the mounting positions P3 and P4 which are different positions have been described as an example. However, in the second example, the case of the same mounting position will be described. As shown in FIG. 6, for example, the control section 51 determines the direction of movement at the time of imaging, according to each of different supply positions P7 and P8, with respect to a mounting position P6 which is included in the area TR1 of the circuit board CB. That is, the control section 51 changes the direction of movement at the time of imaging, in a case where the supply positions P7 and P8 of the electronic components are different even if the mounting position P6 is the same.

The supply position P7 is a supply position of the feeder 25 disposed at an end portion on the −X-axis direction side, among the feeders 25 (refer to FIG. 1) of the component supply devices 15 which are placed side by side in the X-axis direction. In this case, similar to the first example described above, the control section 51 determines the direction of movement at the time of imaging to be the +X-axis direction with respect to the mounting position P6 which is included in the area TR1.

The mounting nozzle of the mounting head 33 moves from the supply position P7 to the mounting position P6 through a moving route R5 shown in FIG. 6.

On the other hand, the supply position P8 is located on the −X-axis direction side compared to the imaging position P2, similar to the supply position P7. However, the supply position P8 is disposed at a central portion in the X-axis direction of the component supply device 15. Therefore, in the supply position P8, the distance in the X-axis direction between the supply position P8 and the imaging position P2, that is, the second X-axis distance Dx (refer to FIG. 3), is shorter than that in the supply position P7. Here, for example, if the mounting head 33 starts to move at the same time in both the +X-axis direction and the +Y-axis direction from the supply position P8, since the second X-axis distance Dx is short, the position in the X-axis direction precedes compared to the position in the Y-axis direction, thereby becoming the same position as the imaging position P2. Therefore, the mounting head 33 needs to stop the movement in the +X-axis direction before it reaches the imaging position P2, and the imaging during movement in the +X-axis direction becomes difficult. For this reason, in the case at the supply position P8, it is preferable that the mounting head 33 moves with the direction of movement at the time of imaging set to be the +Y-axis direction, as in a moving route R6 shown in FIG. 6.

For example, the control section 51 determines and manages the direction of movement at the time of imaging, according to the number of a slot to which the feeder 25 is connected, of the common base 11 (refer to FIG. 1). The control section 51 makes the direction of movement at the time of imaging the +Y-axis direction in a case of supplying a component from the feeder 25 which is connected to an area of a central portion in the X-axis direction of the component supply device 15, for example, a slot of a slot position SP1 of FIG. 6. Further, the control section 51 determines the direction of movement at the time of imaging to be the +X-axis direction or the −X-axis direction in a case of supplying a component from each of the feeders 25 which are connected to slots of slot positions SP2 of both end portions in the X-axis direction of the component supply device 15. In this way, the mounting head 33 optimizes the direction of movement at the time of imaging, according to the second X-axis distance Dx, whereby it becomes possible to more reliably shorten the movement time from each at the supply positions P7 and P8 to the mounting position P6.

Further, the control section 51 may determine the direction of movement at the time of imaging with a combination of the control method in the first example and the control method in this example. For example, the control section 51 determines the direction of movement at the time of imaging of each sequence, based on the areas TR1 to TR3. Next, the control section 51 changes the direction of movement at the time of imaging of a sequence in which the direction of movement at the time of imaging is the +X-axis direction or the −X-axis direction in spite of supplying an electronic component from a supply position which is included in the slot position SP1, to the +Y-axis direction. In this way, the mounting head 33 can attain shortening of a mounting time. Further, the control section 51 may select the moving route in which the movement time becomes the shortest, out of the moving routes determined by the respective determination methods of the first example (the determination of the direction of movement at the time of imaging, based on the first X-axis distance Lx and the first Y-axis distance Ly) and the second example (the determination of the direction of movement at the time of imaging, based on the second X-axis distance Dx), and the direction of movement at the time of imaging thereof.

Further, as described above, in the direction of movement at the time of imaging, an optimal direction is different according to a supply position or a mounting position. For this reason, the control section 51 may determine a supply position (disposition of the feeder 25) according to each mounting position of the circuit board CB and optimize the direction of movement at the time of imaging. For example, the control section 51 notifies an operator so as to connect the feeder 25 which supplies an electronic component which is mounted within the area TR3, to the slot of the slot position SP1, at the time of a setup change in which a board type of the circuit board CB which is produced is changed and the replacement of the feeder 25 occurs. Similarly, the control section 51 notifies an operator so as to connect the feeder 25 which supplies an electronic component which is mounted within each of the areas TR1 and TR2, to the slot of the slot position SP2. In this way, the disposition of the feeder 25 is optimized according to the direction of movement at the time of imaging.

Further, the control section 51 may carry out the optimization of the direction of movement at the time of imaging by changing the stop position of the circuit board CB, in addition to a change of the disposition of the feeder 25. FIG. 7 shows the positional relationship between the stop position of the circuit board CB and the supply position. In the board conveyance device 13 (refer to FIG. 1) which is provided with two conveyance devices; the first and second conveyance devices 21 and 23, as in the first example, the distance in the Y-axis direction between the first conveyance device 21 and the component supply device 15 (the first Y-axis distance Ly (refer to FIG. 3)) is different from the first Y-axis distance Ly between the second conveyance device 23 and the component supply device 15. For example, in a circuit board CB1 which is conveyed in the first conveyance device 21, the first Y-axis distance Ly is short compared to that in a circuit board CB2 which is conveyed in the second conveyance device 23, and therefore, a possibility that it may become effective to make the direction of movement at the time of imaging the +X-axis direction is high. Therefore, the control section 51 makes a stop position at which the first conveyance device 21 stops the circuit board CB1 be on the +X-axis direction side with respect to the imaging position P2. Further, the control section 51 makes a supply position P11 of an electronic component to be mounted on the circuit board CB1 a supply position which is included in the slot position SP2 close to an end portion in the –X-axis direction in the component supply device 15. In this way, the control section 51 makes the direction of movement at the time of imaging the +X-axis direction, whereby it becomes possible to attain shortening of a time in which the mounting head 33 moves in a moving route R7 from the supply position P11 to a mounting position P13 of the circuit board CB1.

Similarly, in the circuit board CB2 which is conveyed in the second conveyance device 23, the first Y-axis distance Ly is relatively long, and therefore, a possibility that it may become effective to make the direction of movement at the time of imaging the +Y-axis direction is high. Therefore, the control section 51 fits a stop position at which the second conveyance device 23 stops the circuit board CB2, to a position in the X-axis direction of the imaging position P2. Further, the control section 51 makes a supply position P12 of an electronic component to be mounted on the circuit board CB2 a supply position which is included in the slot position SP1 of a central portion in the X-axis direction in the component supply device 15. In this way, the control section 51 makes the direction of movement at the time of imaging the +Y-axis direction, whereby it becomes possible to attain shortening of a time in which the mounting head 33 moves in a moving route R8 from the supply position P12 to a mounting position P14 of the circuit board CB2.

According to this example described above in detail, the following effects are exhibited.

Effect 1

The control section 51 makes the direction of movement at the time of imaging the +Y-axis direction in a case of supplying a component from the feeder 25 which is connected to the slot of the slot position SP1 of the central portion in the X-axis direction of the component supply device 15. Further, the control section 51 determines the direction of movement at the time of imaging to be the +X-axis direction or the -X-axis direction in a case of supplying a component from each of the feeders 25 which are connected to slots of slot positions SP2 of both end portions in the X-axis direction of the component supply device 15. In this manner, by optimizing the direction of movement at the time of imaging according to the second X-axis distance Dx, the control section 51 can appropriately carry out shortening of a mounting time.

Effect 2

The control section 51 makes the stop position at which the first conveyance device 21 stops the circuit board CB1 be on the +X-axis direction side with respect to the imaging position P2. Further, the control section 51 makes the supply position P11 of an electronic component to be mounted on the circuit board CB1 a position close to an end portion in the –X-axis direction in the component supply device 15. The imaging position P2 is disposed between the mounting position P13 of the circuit board CB1 and the supply position Pl2 in the X-axis direction. In this way, the control section 51 changes the stop position of the circuit board CB 1 and the supply position P11, thereby optimizing the direction of movement at the time of imaging to the +X-axis direction, whereby it becomes possible to attain shortening of a mounting time.

Effect 3

The control section 51 shortens the distance in the X-axis direction between the stop position and the imaging position P2 by fitting the stop position at which the second conveyance device 23 stops the circuit board CB2, to the position in the X-axis direction of the imaging position P2. Further, the control section 51 makes the supply position P12 of an electronic component to be mounted on the circuit board CB2 the position of the central portion in the X-axis direction in the component supply device 15. In this way, the control section 51 makes the direction of movement at the time of imaging the +Y-axis direction, whereby it becomes possible to attain shortening of a mounting time.

Third Example (Optimization of Supply Position)

Next, a third example embodying the present disclosure will be described with reference to FIG. 8. In the first example and the second example described above, in order to make it easier to understand the contents of the description, a configuration has been described in which the mounting nozzle mounted on the nozzle holder 37 of the mounting head 33 is 1 piece. However, also in a configuration in which the nozzle holder 37 is provided with a plurality of mounting nozzles, the optimization of the direction of movement at the time of imaging is likewise possible. Further, in a case where electronic components which are supplied from different supply positions are obtained by each of the plurality of mounting nozzles, by correlating the order of the mounting nozzle obtaining the electronic component with the direction of movement at the time of imaging, shortening of a mounting time becomes possible.

Specifically, FIG. 8 shows a moving route R11 in which the mounting head 33 obtains electronic components from a plurality of supply positions P16 and P17 by a plurality of mounting nozzles. The moving route R11 indicates a moving route in which an electronic component is obtained from each at the supply positions P16 and P17 and the obtained electronic component is mounted on the circuit board CB1 of the first conveyance device 21. A mounting position P18 of the circuit board CB1 indicates a position at which an electronic component is mounted in the previous sequence. Further, a mounting position P19 of the circuit board CB1 indicates a position at which an electronic component obtained at the supply position P17 is mounted.

Here, in the component mounting machine 10 of the related art, in a case where the order of mounting an electronic component on the circuit board CB1 is set in a production job, also with respect to the order of obtaining an electronic component from each at the supply positions P16 and P17, the same order as the mounting order is used. For example, it is assumed that the mounting order of mounting an electronic component obtained at the supply position P16 on the circuit board CB1, next to an electronic component obtained at the supply position P17, is set in a production job. In this case, the obtaining order is to obtain the electronic component at the supply position P17, which is mounted ahead, and then obtain the electronic component at the supply position P16, which is mounted later. However, taking into account the implementation of the imaging during movement, the obtaining order according to the mounting order is not an optimized order.

Regarding this, in this example, the obtaining order of an electronic component is optimized in accordance with the direction of movement at the time of imaging.

The control section 51 makes the stop position at which the first conveyance device 21 stops the circuit board CB1 be on the +X-axis direction side with respect to the imaging position P2, in order to make the direction of movement at the time of imaging the +X-axis direction, for example. Further, the control section 51 sets the obtaining order of each sequence so as to finally obtain a supply position on the side closest to the −X-axis direction side, in other words, a supply position in which the second X-axis distance Dx (refer to FIG. 3) becomes the longest, among a plurality of electronic component supply positions. In the example shown in FIG. 8, the mounting order is made to be an order of mounting an electronic component obtained at the supply position P17 and then mounting an electronic component obtained at the supply position P16. On the other hand, the obtaining order is made to be an order in which the electronic component at the supply position P17 which is on the −X-axis direction side with respect to the supply position P16 is obtained later. The mounting head 33 moves from the mounting position P18 of the previous sequence, to the supply position P16, and then obtains an electronic component by one mounting nozzle among a plurality of mounting nozzles, as shown by the moving route R11. Next, the mounting head 33 moves to the supply position P17 and obtains an electronic component by another mounting nozzle. Next, the mounting head 33 passes through the imaging position P2 while moving in the +X-axis direction. At this time, the images of a plurality of electronic components suctioned to the respective mounting nozzles are captured at the same time or continuously by the camera device 19. Then, the mounting head 33 mounts the electronic component obtained at the supply position P17 at the mounting position P19 and then moves to the next mounting position at which the electronic component obtained at the supply position P16 is mounted.

Further, the control section 51 carries out control in a direction opposite to the above-described control, in a case where the direction of movement at the time of imaging is the +Y-axis direction. For example, in a case where a mounting work in which the direction of movement at the time of imaging is set to be the +Y-axis direction is carried out with respect to the circuit board CB2 held by the second conveyance device 23, the control section 51 sets the obtaining order of obtaining the electronic component at the supply position P16 later.

According to this example described above in detail, the following effects are exhibited.

Effect

The control section 51 performs control of obtaining the electronic component at the supply position P17 in which the second X-axis distance Dx (refer to FIG. 3) is longer, later, in a case where the direction of movement at the time of imaging is determined to be the +X-axis direction. Further, the control section 51 performs control of obtaining the electronic component at the supply position P16 in which the second X-axis distance Dx is shorter, later, in a case where the direction of movement at the time of imaging is determined to be the +Y-axis direction. In this way, the control section 51 optimizes the order of obtaining a plurality of electronic components in accordance with the direction of movement at the time of imaging, whereby it becomes possible to attain shortening of a mounting time.

Fourth Example (Moving Method of Mounting Head provided with a Plurality of Mounting Nozzles)

Next, a fourth example embodying the present disclosure will be described with reference to FIG. 9. The component mounting machine 10 of this example changes the direction of movement of the mounting head 33 provided with a plurality of mounting nozzles, according to the direction of movement at the time of imaging. In each example described above, all the electronic components are captured in an image only by passing the mounting head 33 through the imaging position P2 of the camera device 19 once. However, although it depends on the performance (the size of an imaging region, or the like) of the camera device 19 or the size of an electronic component, it is difficult for the mounting head 33 to put a plurality of electronic components within the imaging region (the imaging position P2) of the camera device 19. Further, also in a case where the number of mounting nozzles is large, similarly, it is difficult for the mounting head 33 to put electronic components which all the mounting nozzles hold, within the imaging region. In this case, the mounting head 33 needs to move such that each of a plurality of electronic components is alternately captured in an image.

Figure 9:
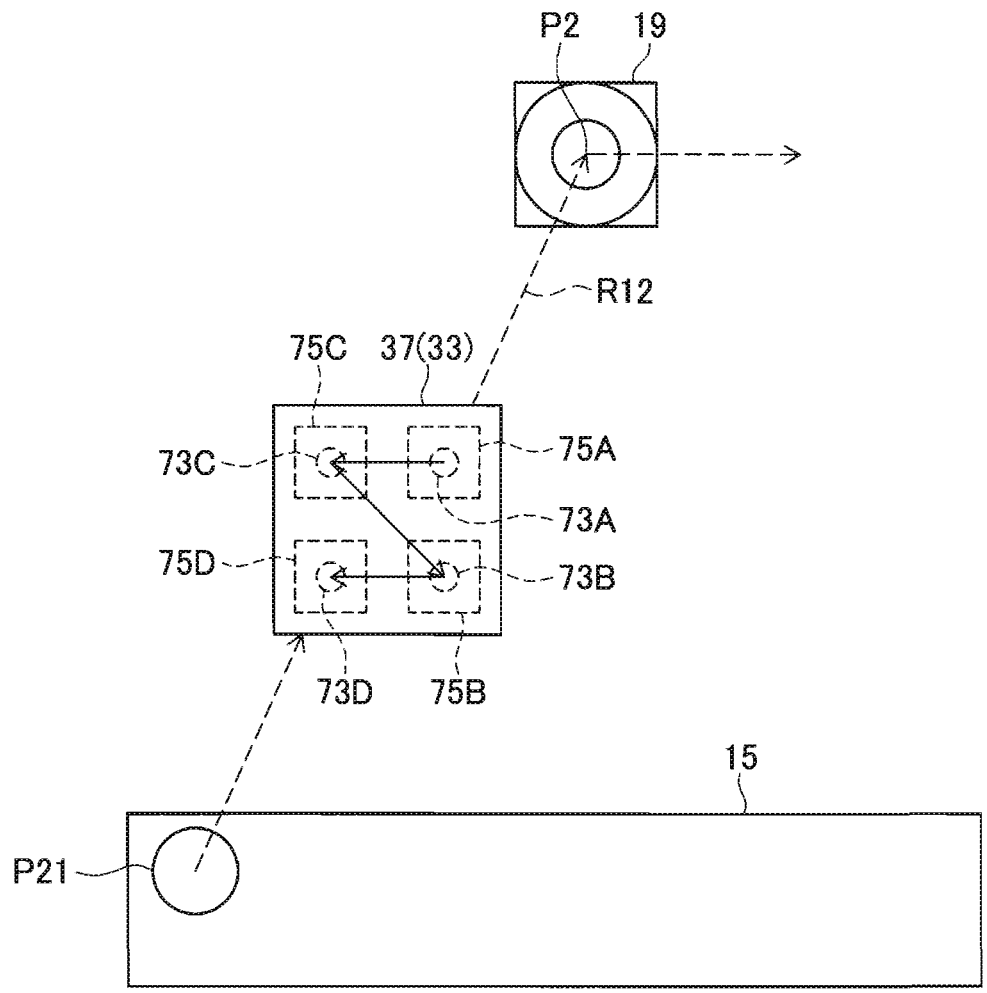
FIG. 9 is a plan view schematically showing a moving route in which a mounting nozzle of a mounting head of a fourth example moves.

The mounting head 33 shown in FIG. 9 has four mounting nozzles 73A to 73D at the nozzle holder 37. In the mounting nozzles 73A to 73D, when viewed in a plan view of FIG. 9, the mounting nozzle 73A is located on the upper right side of the nozzle holder 37, the mounting nozzle 73B is located on the lower right side, the mounting nozzle 73C is located on the upper left side, and the mounting nozzle 73D is located on the lower left side. The nozzle holder 37 is rotated by the driving of the R-axis rotational driving mechanism 45 (refer to FIG. 2), and therefore, the positions of the mounting nozzles 73A to 73D are changed according to the rotation. Electronic components 75A to 75D each having a large size are held in this order on the respective mounting nozzles 73A to 73D. The camera device 19 captures images of the electronic components 75A to 75D one by one. Further, a supply position P21 indicates a supply position of the electronic component which the mounting head 33 finally obtains, among the plurality of electronic components 75A to 75D, The control section 51 temporarily stops the mounting head 33 at the imaging position P2 of the camera device 19. Then, the control section 51 moves the mounting head 33 in the X-axis direction and the Y-axis direction in order to alternately put each of the plurality of electronic components 75A to 75D within the imaging region of the imaging position P2. The camera device 19 carries out imaging each time the electronic components 75A to 75D suctioned to the mounting nozzles 73A to 73D move to the imaging position P2 according to the movement of the mounting head 33.

Specifically, the control section 51 determines the mounting nozzles 73A to 73D, that is, the electronic components 75A to 75D, to be first captured in an image, based on the supply position P21 at which the electronic component is finally obtained. The control section 51 determines, as the electronic components 75A to 75D to be first captured in an image, for example, a component which becomes the lead with respect to a direction (a direction along a moving route R12 in the drawing) toward the imaging position P2 from the supply position P21. The moving route R12 is a moving route toward the +X-axis direction and the +Y-axis direction from the −X-axis direction and the −Y-axis direction. Therefore, the component which is located at the lead with respect to a direction of movement is the electronic component 75A which is located on the upper right side of the mounting head 33 when viewed in a plan view. In this manner, the control section 51 determines an electronic component to be first captured in an image, from the relationship between the direction of movement and the disposition of the mounting nozzles 73A to 73D, in each sequence. In this way, the control section 51 can advance a start timing of imaging after the mounting head 33 is moved to the camera device 19.

Further, the control section 51 appropriately changes the electronic components 75A to 75D to be first captured in an image, according to a component size, the disposition of the mounting nozzles 73A to 73D, or the like. In the example described above, the control section 51 makes one mounting nozzle 73A and one electronic component 75A the setting which is first captured in an image. However, two or more mounting nozzles 73A to 73D and two or more electronic components 75A to 75D may be set together to be the setting which is first captured in an image. Further, for example, in a case where the nozzle holder 37 has the plurality of mounting nozzles 73A to 73D provided annularly, the control section 51 may make the plurality of mounting nozzles 73A to 73D and the electronic components 75A to 75D arranged in a circumferential direction be set together to be the setting which is first captured in an image.

Here, the control section 51 needs to temporarily stop the mounting head 33 at the imaging position P2 in order to capture images of the plurality of electronic components 75A to 75D. For this reason, the control section 51 cannot complete imaging only by passing the mounting head 33 through the imaging position P2 once. Regarding this, the control section 51 of this example determines a direction of moving the mounting head 33 for the following final imaging after the ending of the last imaging before final imaging among a plurality of times of imaging which capture the respective images of the plurality of electronic components 75A to 75D, to be a direction toward the first mounting position from the imaging position P2 after imaging. In this way, in the imaging of the final electronic component of the electronic components 75A to 75D, the imaging during movement becomes possible, and the mounting head 33 can move toward the mounting position from the imaging position P2 by accelerating in one direction while performing imaging.

The control section 51 determines a direction of movement (the X-axis direction or the Y-axis direction) after the ending of the final imaging, by, for example, the determination method based on the first X-axis distance Lx and the first Y-axis distance Ly (refer to FIG. 3) carried out in the first example. This direction becomes the direction of movement at the time of imaging, because the imaging during movement is carried out when performing the imaging of the final electronic component of the electronic components 75A to 75D. The control section 51 determines, for example, the direction of movement at the time of imaging to be the +X-axis direction. Then, the control section 51 determines the imaging order, based on the determined direction of movement at the time of imaging and the electronic component 75A which is first captured in an image. The imaging order becomes, for example, the order indicated by arrows in the drawing (the electronic component 75A→75C→75B→75D). The control section 51 carries out the imaging of the final electronic component 75D when the mounting head 33 is moved in the +X-axis direction (the direction of movement at the time of imaging) with the position in the Y-axis direction fixed, after the imaging of the electronic component 75B, which is the last imaging before the final imaging, is ended. In this way, it becomes possible to attain shortening of the movement time of the mounting head 33 from the imaging position P2 to the first imaging position.

The moving method described above is an example and is appropriately changed. For example, the control section 51 makes the imaging order the following order (the electronic component 75A→75C→75D→75B) in a case where the direction of movement at the time of imaging which moves after the final imaging is ended is determined to be the −X-axis direction. In this case, after the imaging of the electronic component 75D, which is the last imaging before the final imaging, is ended, when the mounting head 33 is moved in the −X-axis direction with the position in the Y-axis direction fixed, the image of the final electronic component 75B is captured.

Further, the control section 51 can also determine the direction of movement at the time of imaging to be the +Y-axis direction. In this case, in a case where the electronic component 75A is first captured in an image, the imaging order becomes the following order (the electronic component 75A→75B→75C→75D). In this way, the control section 51 determines the electronic components 75A to 75D to be first captured in an image, from the relationship between the supply position P21 and the direction of movement toward the imaging position P2, and determines the imaging order according to the positions of the determined electronic components 75A to 75D and the direction of movement at the time of imaging.

According to this example described above in detail, the following effects are exhibited.

Effect 1

The control section 51 determines a direction of moving the mounting head 33 for the following final imaging after the ending of the last imaging before final imaging among a plurality of times of imaging which capture the respective images of the plurality of electronic components 75A to 75D, to be a direction toward the first mounting position from the imaging position P2 after imaging. In this way, in the imaging of the final electronic component of the electronic components 75A to 75D, the imaging during movement becomes possible, and the mounting head 33 can move toward the mounting position from the imaging position P2 by accelerating in one direction while performing imaging. Therefore, according to the component mounting machine 10, it becomes possible to attain shortening of the movement time of the mounting head 33.

Effect 2

The control section 51 determines the electronic components 75A to 75D to be first captured in an image, based on the position at the supply position P21 at which the electronic component is finally obtained, and the subsequent direction of movement. In this way, the control section 51 can advance a start timing of imaging after the mounting head 33 is moved to the camera device 19. Further, the control section 51 determines the imaging order according to the positions of the determined electronic components 75A to 75D to be first captured in an image, and the direction of movement at the time of imaging, and thus further shortening of a mounting time becomes possible.

Fifth Example (Control Method of Configuration having Two Mounting Heads)

Figure 10:
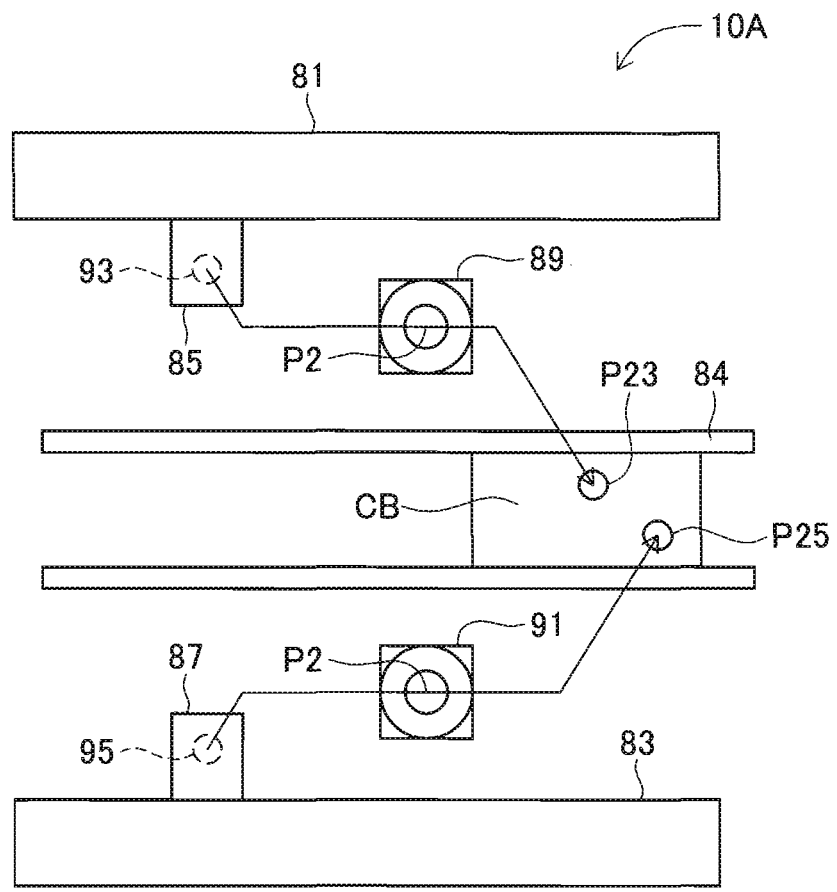
FIG. 10 is a plan view schematically showing device configurations of two mounting heads with which a component mounting machine of a fifth example is provided.

Next, a fifth example embodying the present disclosure will be described with reference to FIGS. 10 and 11. This example is different from the above-described first example in that in the head driving mechanism 17 of the first example, a configuration is made in which a single slider 31 on which the mounting head 33 is mounted is provided, whereas in this example, the mounting head 33 is provided at each of a plurality of sliders 31. FIG. 10 is a plan view schematically showing two sliders 81 and 83 with which a component mounting machine 10A of this example is provided. In the component mounting machine 10A, a conveyance device 84 is provided at a central portion in the Y-axis direction. The component mounting machine 10A is provided with a pair of sliders 81 and 83 which faces each other in the Y-axis direction with the conveyance device 84 interposed therebetween. Mounting heads 85 and 87 are respectively mounted on the sliders 81 and 83.

The mounting head 85 moves to an arbitrary position on the frame section 35 (refer to FIG. 1) by the driving of the driving mechanisms 41 and 43 (refer to FIG. 2) corresponding to the slider 81. Similarly, the mounting head 87 moves to an arbitrary position on the frame section 35 by the driving of the driving mechanisms 41 and 43 corresponding to the slider 83. Further, the component mounting machine 10A is provided with a pair of camera devices 89 and 91 which faces each other in the Y-axis direction with the conveyance device 84 interposed therebetween. When the mounting head 85 passes through the imaging position P2 of the camera device 89 in the direction of movement at the time of imaging which is, for example, the +X-axis direction, the image of the electronic component of a mounting nozzle 93 is captured, and after the mounting head 85 passes through the imaging position P2, the mounting head 85 mounts the electronic component at a mounting position P23 of the circuit board CB. Further, when the mounting head 87 passes through the imaging position P2 of the camera device 91 in the direction of movement at the time of imaging which is, for example, the +X-axis direction, the image of the electronic component of a mounting nozzle 95 is captured, and after the mounting head 87 passes through the imaging position P2, the mounting head 87 mounts the electronic component at a mounting position P25 of the circuit board CB. Also in the component mounting machine 10A having such a configuration, the control section 51 controls the movement of the mounting heads 85 and 87 in the direction of movement at the time of imaging determined based on the positional relationship between the supply position, the imaging position P2, and the mounting positions P23 and P25, similar to each example described above, whereby it becomes possible to attain shortening of a mounting time.

Further, the control section 51 controls the mounting heads 85 and 87 with them interlocked with one another, when the orders of sequences are the same and the mounting heads 85 and 87 pass through the imaging positions P2 of the camera devices 89 and 91, which are the same in the same direction of movement at the time of imaging. Specifically, there is a case where the camera devices 89 and 91 are different in imaging performance for various reasons. For example, it is conceivable to attain a reduction in manufacturing cost by making a configuration having a high-resolution camera device and a low-resolution camera device and selectively using the camera device which is used, as necessary. Alternatively, it is conceivable that a high-resolution camera device and a camera device having a large imaging region are provided, thereby increasing the types of electronic components with which can be dealt. In any case, in a case where the imaging performances of the camera devices 89 and 91 are different, the control section 51 can perform control of making the mounting heads 85 and 87 share and use the camera devices 89 and 91. Therefore, according to a sequence, there is also a case where the mounting head 85 uses the camera device 91 and there is also a case where the mounting head 87 uses the camera device 89. In this case, the control section 51 controls the mounting heads 85 and 87 with them interlocked with one another, in a sequence in which the camera devices 89 and 91 that the mounting heads 85 and 87 use become the same.

Figure 11:
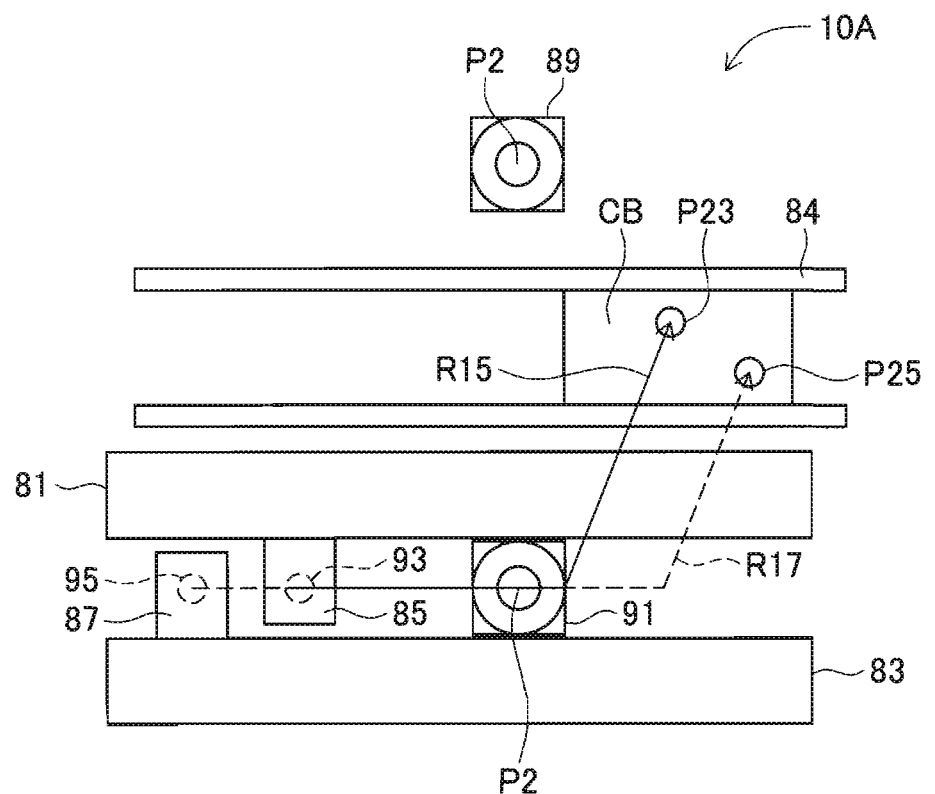
FIG. 11 is a plan view schematically showing a moving route making two mounting heads pass through an imaging position in conjunction with each other.

The control section 51 moves the sliders 81 and 83 to positions close to each other in the Y-axis direction, in a case where each of the order of the sequence, the direction of movement at the time of imaging (for example, the +X-axis direction), and the imaging position P2 (the camera device 91) becomes the same, as shown in FIG. 11. Further, the control section 51 controls the sliders 81 and 83, thereby fitting the positions in the Y-axis direction of the mounting heads 85 and 87 to the imaging position P2 of the camera device 91, and shifting the mutual positions in the X-axis direction of the mounting heads 85 and 87. In a case of sharing the camera device 91 shown in FIG. 11, the slider 83 is in a state where the slider 81 is interposed between the slider 83 and the circuit board CB in the Y-axis direction. In this case, the slider 81 needs to move toward the circuit board CB before the slider 83 moves toward the circuit board CB in the Y-axis direction. For this reason, the mounting head 85 of the slider 81 needs to terminate imaging by the camera device 91 and start the movement in the Y-axis direction, earlier than the mounting head 87 of the slider 83. Therefore, the control section 51 shifts the position in the X-axis direction of the mounting head 85 to the +X-axis direction side, compared to the mounting head 87. Further, in a case where the direction of movement at the time of imaging is the −X-axis direction, the control section 51 shifts the position in the X-axis direction of the mounting head 85 to the −X-axis direction side, compared to the mounting head 87. Further, in a case of sharing the camera device 89 on the other side, the control section 51 disposes the mounting heads 85 and 87 at positions to which the slider 83 can move ahead, contrary to the positions described above.

Then, the mounting heads 85 and 87 move in the +X-axis direction at the same time from the state shown in FIG. 11. The camera device 91 carries out the imaging during movement in the order of the mounting head 85 and the mounting head 87. In this way, in a case where each of the mounting heads 85 and 87 shares and uses a single camera device, an imaging wait time is shortened. Then, after the mounting head 85 passes through the imaging position P2, prior to the mounting head 87, the mounting head 85 moves toward the mounting position P23 (refer to a moving route R15 of the drawing). Further, after the mounting head 87 passes through the imaging position P2, the mounting head 87 moves toward the mounting position P25 (refer to a moving route R17 of the drawing).

The control content by the control section 51 described above is an example and can be appropriately changed. For example, the control section 51 may carry out control of switching the order of the sequence of a production job such that the number of times that the mounting heads 85 and 87 can perform the imaging during movement with them interlocked with one another increases. Further, the control section 51 may carry out control of interlocking a plurality of mounting heads 85 and 87 that are three or more.

According to this example described above in detail, the following effects are exhibited.

Effect

The control section 51 carries out the imaging during movement by interlocking the two mounting heads 85 and 87 in a case where each of the order of the sequence, the direction of movement at the time of imaging, and the camera devices 89 and 91 becomes the same. In this way, in a case where each of the mounting heads 85 and 87 shares and uses the camera devices 89 and 91, an imaging wait time is shortened. Therefore, according to the component mounting machine 10A, it becomes possible to attain shortening of a mounting time.

The present disclosure is not limited to each example described above, and it is needless to say that various improvements and changes can be made within a scope which does not depart from the gist of the present invention. For example, in each example described above, the supply position is located on the -X-axis direction side with respect to the imaging position and the mounting position is located on the +X-axis direction side with respect to the imaging position. However, there is no limitation thereto. For example, a configuration may also be made in which the supply position is located on the +X-axis direction side and the mounting position is located on the -X-axis direction side. In this case, the direction of movement at the time of imaging is appropriately changed.

Further, the camera device 19 may have a configuration in which the installation position thereof is not fixed and is movable. For example, the camera device 19 may have a configuration in which it is movable in the X-axis direction and the Y-axis direction, based on the control from the control section 51. In this case, the control section 51 may perform a determination including even the conditions for moving the camera device 19 (the imaging position P2), in the determination of the direction of movement at the time of imaging.

Further, the mounting nozzles 73A to 73D are not limited to a configuration of suctioning the electronic components 75A to 75D by utilizing air pressure, and may have a configuration of holding the electronic components 75A to 75D by using an electromagnetic force, clamping, or the like. Further, in each example described above, as the component mounting device, the component mounting machines 10 and 10A for mounting an electronic component on a circuit board have been described. However, the component mounting device in this application is not limited thereto and may be applied to other component mounting devices such as a working robot for carrying out assembly work of, for example, a secondary battery (a solar cell, a fuel cell, or the like) or the like. In this case, an arm of the working robot becomes an example of the movable section in this application.

REFERENCE SIGNS LIST

10, 10A: component mounting machine, 13: board conveyance device, 15: component supply device, 19, 89, 91: camera device, 21: first conveyance device, 23: second conveyance device, 33, 85, 87: mounting head, 41: X-axis driving mechanism, 43: Y-axis driving mechanism, 51: control section, 73A to 73D, 93, 95: mounting nozzle, 75A to 75D: electronic component, CB, CB1, CB2: circuit board, Lx: first X-axis distance, Ly: first Y-axis distance, Dx: second X-axis distance, P1: supply position, P2: imaging position, P3, P4: mounting position, TR1 to TR3: area

The invention claimed is:

1. A component mounting device comprising:
   component supply devices placed side by side in a first axis direction, the component supply devices supplying a component to be mounted on an object to a supply position;
   a movable section to obtain the component from the supply position and to mount the component at a mounting position of the object;
   a driving mechanism to move the movable section in the first axis direction and a second axis direction orthogonal to the first axis direction, the driving mechanism including an X-Y moving device;
   an imaging device to capture an image of the component held by the movable section, at an imaging position; and
   a control section operatively connected to the driving mechanism, the movable section, and the imaging device, the control section configured to:
      control the driving mechanism to move the movable section from the supply position to the mounting position via the imaging position and in a direction of movement at the time of imaging with either of the first axis direction or the second axis direction set to be the direction of movement at the time of imaging, when the movable section passes through the imaging position,
      determine the direction of movement at the time of imaging, according to a first distance along the first axis direction and a second distance along the second axis direction from the imaging position to the mounting position.

2. The component mounting device according to claim 1, wherein
   the driving mechanism has an acceleration or a maximum speed by which the movable section is moved in the first axis direction and acceleration or a maximum speed by which the movable section is moved in the second axis direction are different from each other, and
   the control section is configured to determine the direction of movement at the time of imaging, based on a relationship between an area set in the object according to the first distance and the second distance and the mounting position, and the area is changed based on a difference between the maximum speed with respect to the first axis direction of the movable section and the maximum speed with respect to the second axis direction, and a difference between the acceleration with respect to the first axis direction of the movable section and the acceleration with respect to the second axis direction.

3. The component mounting device according to claim 1, wherein
   the control section is configured to determine the direction of movement at the time of imaging, according to a third distance along the first axis direction from the supply position to the imaging position.

4. The component mounting device according to claim 1, further comprising:
   a conveyance lane to convey the object in the first axis direction, wherein
   the control section is configured to determine the supply position and a stop position on the conveyance lane where the imaging position is disposed between the supply position and the mounting position of the object stopped at the stop position, in the first axis direction, and a direction toward the mounting position from the supply position becomes the direction of movement at the time of imaging.

5. The component mounting device according to claim 4, wherein a plurality of the conveyance lanes are provided, and the control section is configured to determine a supply position of a component to be mounted on the object which is conveyed by the conveyance lane in which a distance along the second axis direction from the supply device is longer, among the plurality of conveyance lanes, to be a position at which a third distance along the first axis direction from the supply position to the imaging position is shorter.

6. The component mounting device according to claim 1, wherein the movable section is configured to hold a plurality of the components, and the control section is configured to control the movable section in a case where the direction of movement at the time of imaging is determined to be the first axis direction, the movable section obtains a component at the supply position which becomes a position at which a third distance along the first axis direction from the supply position to the imaging position is longer, later, and in a case where the direction of movement at the time of imaging is determined to be the second axis direction, the movable section obtains a component at the supply position which becomes a position at which the third distance is shorter, later.

7. The component mounting device according to claim 1, wherein a plurality of the movable sections are provided, and the control section is configured to control the plurality of movable sections to arrange orders of sequences of moving the movable section from the supply position to the mounting position via the imaging position are the same and which pass through an imaging position of the same imaging device in the same direction of movement at the time of imaging, pass through the imaging position with the movable sections interlocked with one another.

* * * * *